United States Patent
Lo et al.

(10) Patent No.: US 12,277,502 B2
(45) Date of Patent: Apr. 15, 2025

(54) NEURAL NETWORK ACTIVATION COMPRESSION WITH NON-UNIFORM MANTISSAS

(71) Applicant: Microsoft Technology Licensing, LLC, Redmond, WA (US)

(72) Inventors: Daniel Lo, Bothell, WA (US); Amar Phanishayee, Seattle, WA (US); Eric S. Chung, Woodinville, WA (US); Yiren Zhao, Cambridge (GB)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 18/415,159

(22) Filed: Jan. 17, 2024

(65) Prior Publication Data
US 2024/0152758 A1 May 9, 2024

Related U.S. Application Data

(63) Continuation of application No. 18/092,876, filed on Jan. 3, 2023, now Pat. No. 12,067,495, which is a
(Continued)

(51) Int. Cl.
*G06N 3/084* (2023.01)
*G06F 9/30* (2018.01)
(Continued)

(52) U.S. Cl.
CPC ......... *G06N 3/084* (2013.01); *G06F 9/30141* (2013.01); *H03M 7/3059* (2013.01); *H03M 7/46* (2013.01); *H03M 7/702* (2013.01)

(58) Field of Classification Search
CPC .............................. G06N 3/063; G06N 3/084
See application file for complete search history.

(56) References Cited

U.S. PATENT DOCUMENTS 8,401,863 B1 3/2013 Melkote et al.
2004/0255284 A1 12/2004 Kobayashi
(Continued)

FOREIGN PATENT DOCUMENTS

CN 109063825 A 12/2018
WO WO 2018213636 11/2018

OTHER PUBLICATIONS

Notice of Allowance mailed on Mar. 6, 2024, in U.S. Appl. No. 16/237,202, 11 pages.
(Continued)

*Primary Examiner* — Michael J Metzger
(74) *Attorney, Agent, or Firm* — Klarquist Sparkman, LLP

(57) ABSTRACT

Apparatus and methods for training a neural network accelerator using quantized precision data formats are disclosed, and in particular for storing activation values from a neural network in a compressed format having lossy or non-uniform mantissas for use during forward and backward propagation training of the neural network. In certain examples of the disclosed technology, a computing system includes processors, memory, and a compressor in communication with the memory. The computing system is configured to perform forward propagation for a layer of a neural network to produced first activation values in a first block floating-point format. In some examples, activation values generated by forward propagation are converted by the compressor to a second block floating-point format having a non-uniform and/or lossy mantissa. The compressed activation values are stored in the memory, where they can be retrieved for use during back propagation.

20 Claims, 16 Drawing Sheets

Related U.S. Application Data continuation of application No. 16/256,998, filed on Jan. 24, 2019, now Pat. No. 11,562,247.

(51) Int. Cl.
*H03M 7/30* (2006.01)
*H03M 7/46* (2006.01)

(56) References Cited

U.S. PATENT DOCUMENTS

| | | | |
|---|---|---|---|
| 2009/0037709 | A1 | 2/2009 | Ishii |
| 2012/0262597 | A1 | 10/2012 | Frantz |
| 2016/0117153 | A1 | 4/2016 | Salmon-Legagneur et al. |
| 2017/0286421 | A1 | 10/2017 | Hayenga et al. |
| 2017/0286830 | A1 | 10/2017 | El-Yaniv et al. |
| 2018/0157465 | A1 | 6/2018 | Bittner et al. |
| 2018/0322607 | A1 | 11/2018 | Mellempudi et al. |
| 2019/0079727 | A1 | 3/2019 | Chen et al. |
| 2019/0163902 | A1 | 5/2019 | Reid et al. |
| 2019/0258921 | A1* | 8/2019 | Lie ............................ G06F 13/00 |
| 2019/0347072 | A1 | 11/2019 | Lo et al. |
| 2020/0014137 | A1 | 1/2020 | Phillips et al. |
| 2020/0104137 | A1 | 4/2020 | Natarajan et al. |
| 2020/0150968 | A1 | 5/2020 | Fatehi et al. |
| 2020/0159068 | A1 | 5/2020 | Fatehi et al. |
| 2023/0140185 | A1 | 5/2023 | Lo et al. |

OTHER PUBLICATIONS

Final Office Action mailed on Oct. 18, 2023, in U.S. Appl. No. 16/237,202, 69 pages.
International Preliminary Report on Patentability in PCT/US2020/012289, mailed Aug. 5, 2021, 8 pages.
International Preliminary Report on Patentability in PCT/US2019/066433, mailed Jul. 15, 2021, 9 pages.
International Preliminary Report on Patentability in PCT/US2019/0666675, mailed Jul. 15, 2021, 9 pages.
International Search Report for PCT/US2022/031863, mailed Sep. 15, 2022, 12 pages.
Ntention to grant for EP Application No. 19839200.3, mailed Aug. 8, 2023, 8 pages.
Notice of Allowance for U.S. Appl. No. 18/092,876, filed Oct. 2, 2023, 10 pages.
Notice of Allowance mailed on Mar. 25, 2024, in U.S. Appl. No. 18/092,876, 5 pages.
Office Action Received for Chinese Application No. 202080010832.5, mailed on Apr. 28, 2024, 15 pages.
Final Office Action issued in U.S. Appl. No. 16/237,202, mailed Oct. 18, 2023, 69 pages.
Intention to grant for EP Application No. 19839200.3, mailed Aug. 8, 2023, 8 pages.
Notice of Allowance issued in European Patent Application No. 19839200.3, mailed Aug. 8, 2023, 8 pages.
Notice of Allowance issued in U.S. Appl. No. 18/092,876, mailed Oct. 2, 2023, 10 pages.
Drumond, et al., "Training DNNs with Hybrid Block Floating Point", 32nd Conference on Neural Information Processing Systems, 2018, 11 Pages.
Ling, et al., "Harnessing Numerical Flexibility for Deep Learning on FPGAs", Proceedings of the 9th International Symposium on Highly-Efficient Accelerators and Reconfigurable Technologies, 2018, 3 Pages.
Office Action Received for Chinese Application No. 201980087238.3, mailed on Jan. 8, 2024, 19 pages (English Translation Provided).
Second Office Action Received for Chinese Application No. 202080010832.5, mailed on Oct. 23, 2024, 10 pages (English Translation Provided).

* cited by examiner

FIG. 4
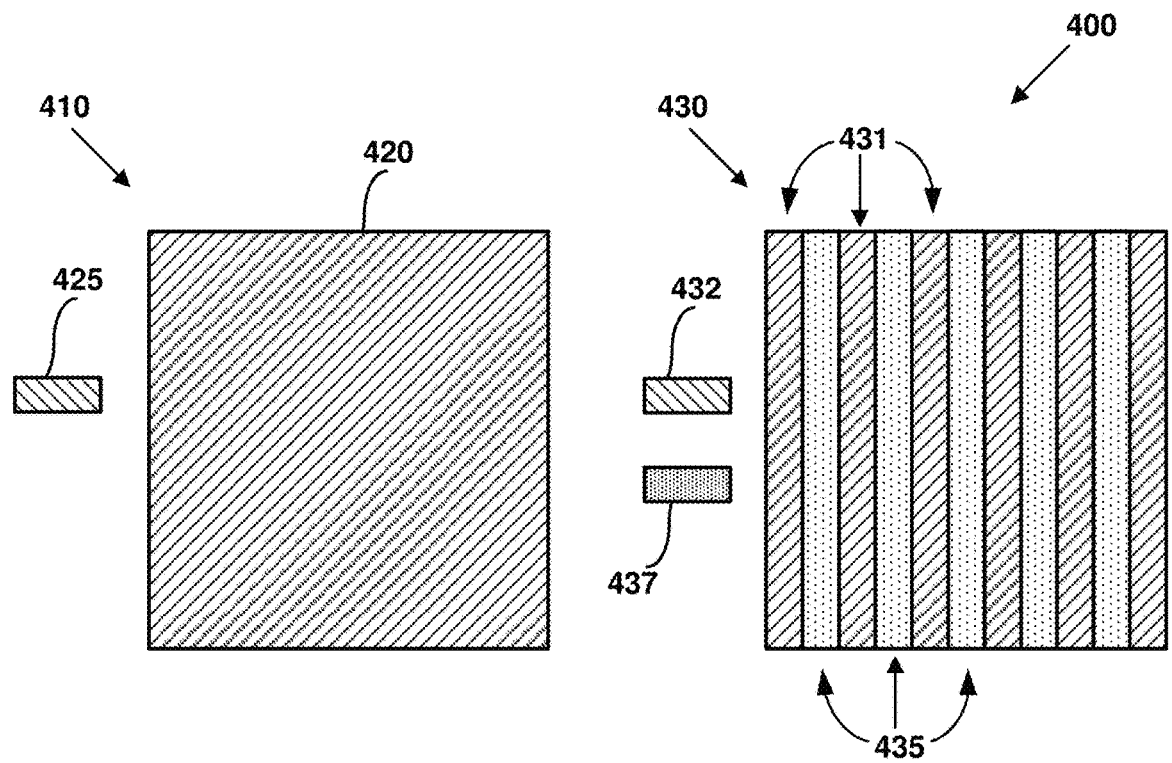
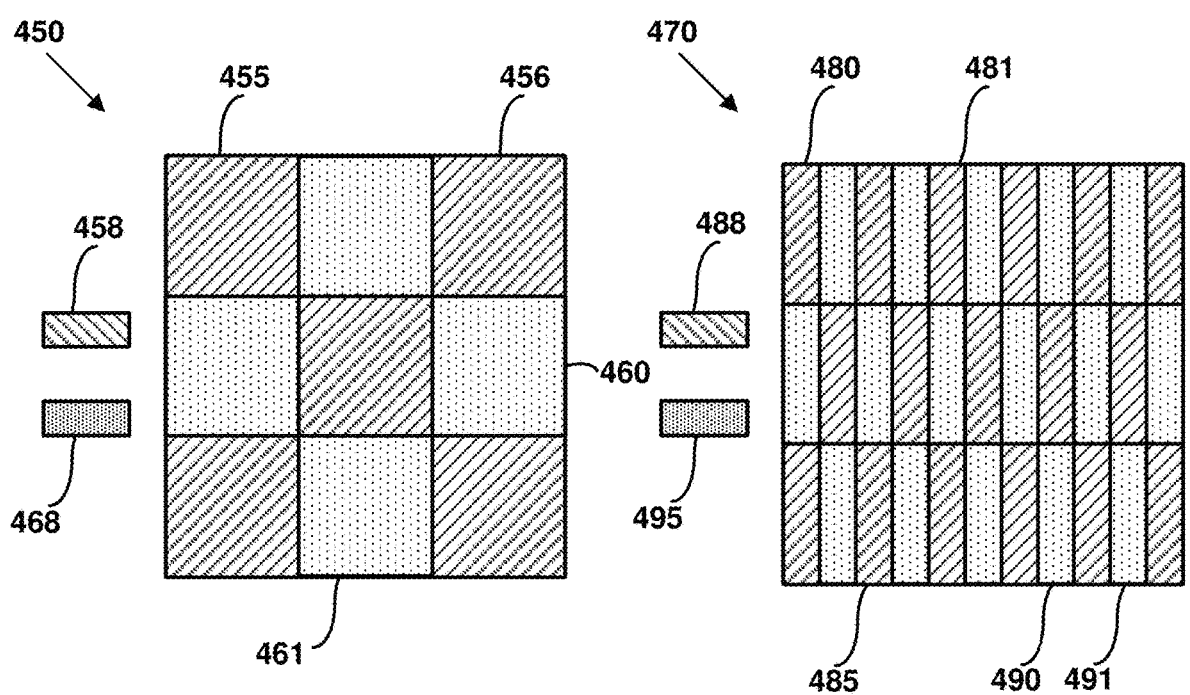

FIG. 5
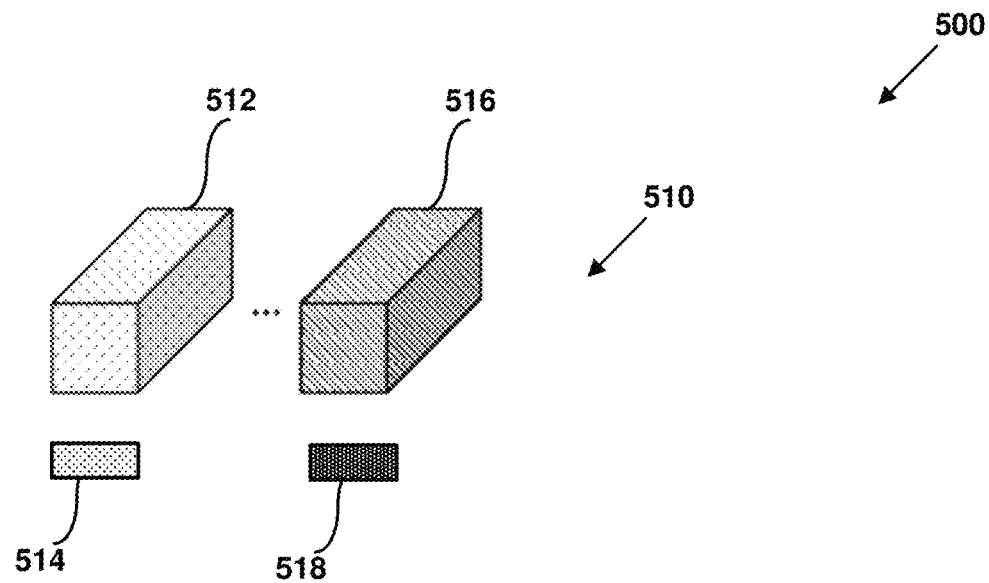
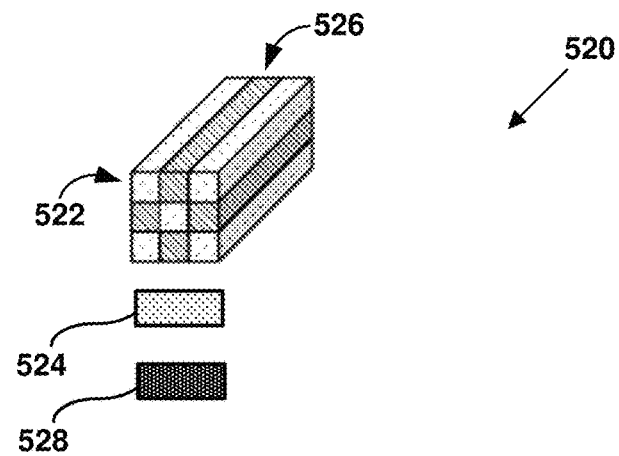
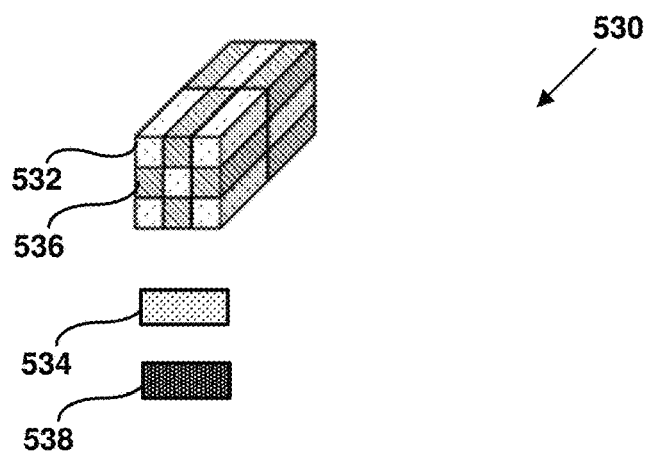

NEURAL NETWORK ACTIVATION COMPRESSION WITH NON-UNIFORM MANTISSAS

CROSS-REFERENCE TO RELATED APPLICATION

This is a continuation of U.S. patent application Ser. No. 18/092,876, filed Jan. 3, 2023, which is a continuation of U.S. application Ser. No. 16/256,998, filed Jan. 24, 2019, now U.S. Pat. No. 11,562,247, which applications are incorporated herein by reference in their entireties.

BACKGROUND

Machine learning (ML) and artificial intelligence (AI) techniques can be useful for solving a number of complex computational problems such as recognizing images and speech, analyzing and classifying information, and performing various classification tasks. Machine learning is a field of computer science that uses statistical techniques to give computer systems the ability to extract higher-level features from a set of training data. Specifically, the features can be extracted by training a model such as an artificial neural network (NN) or a deep neural network (DNN). After the model is trained, new data can be applied to the model and the new data can be classified (e.g., higher-level features can be extracted) using the trained model. Machine learning models are typically executed on a general-purpose processor (also referred to as a central processing unit (CPU)). However, training the models and/or using the models can be computationally expensive and so it may not be possible to perform feature extraction in real-time using general-purpose processors. Accordingly, there is ample opportunity for improvements in computer hardware and software to implement neural networks.

SUMMARY

Apparatus and methods are disclosed for storing activation values from a neural network in a compressed format for use during forward and backward propagation training of the neural network. Computing systems suitable for employing such neural networks include computers having general-purpose processors, neural network accelerators, or reconfigurable logic devices, such as Field programmable gate arrays (FPGA). Activation values generated during forward propagation can be "stashed" (temporarily stored in bulk memory) in a compressed format and retrieved for use during backward propagation. The activation values used during training can be expressed in a quantized or block floating-point format (BFP). The activation values stashed can be in a further compressed format than the format used during the training. In some examples, the compressed formats include lossy or non-uniform mantissas for compressed values.

In some examples of the disclosed technology, a computer system includes general-purpose and/or special-purpose neural network processors, bulk memory including computer-readable storage devices or memory, and a block floating-point compressor in communication with the bulk memory. As forward propagation occurs during training of neural network, activation values are produced in a first block floating-point format. The block floating-point is used to convert the activation values to a number format having a numerical precision less than the precision of the first block floating format. The compressed activation values are stored in the bulk memory for use during backward propagation.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. The foregoing and other objects, features, and advantages of the disclosed subject matter will become more apparent from the following detailed description, which proceeds with reference to the accompanying figures.

BRIEF DESCRIPTION OF THE DRAWINGS

FIG. 4 depicts a number of example block floating-point formats that can be used to represent quantized neural network models, as can be used in certain examples of the disclosed technology.

FIG. 5 depicts a number of example block floating-point formats that can be used to represent quantized neural network models, as can be used in certain examples of the disclosed technology.

DETAILED DESCRIPTION

I. General Considerations

Figure 1:
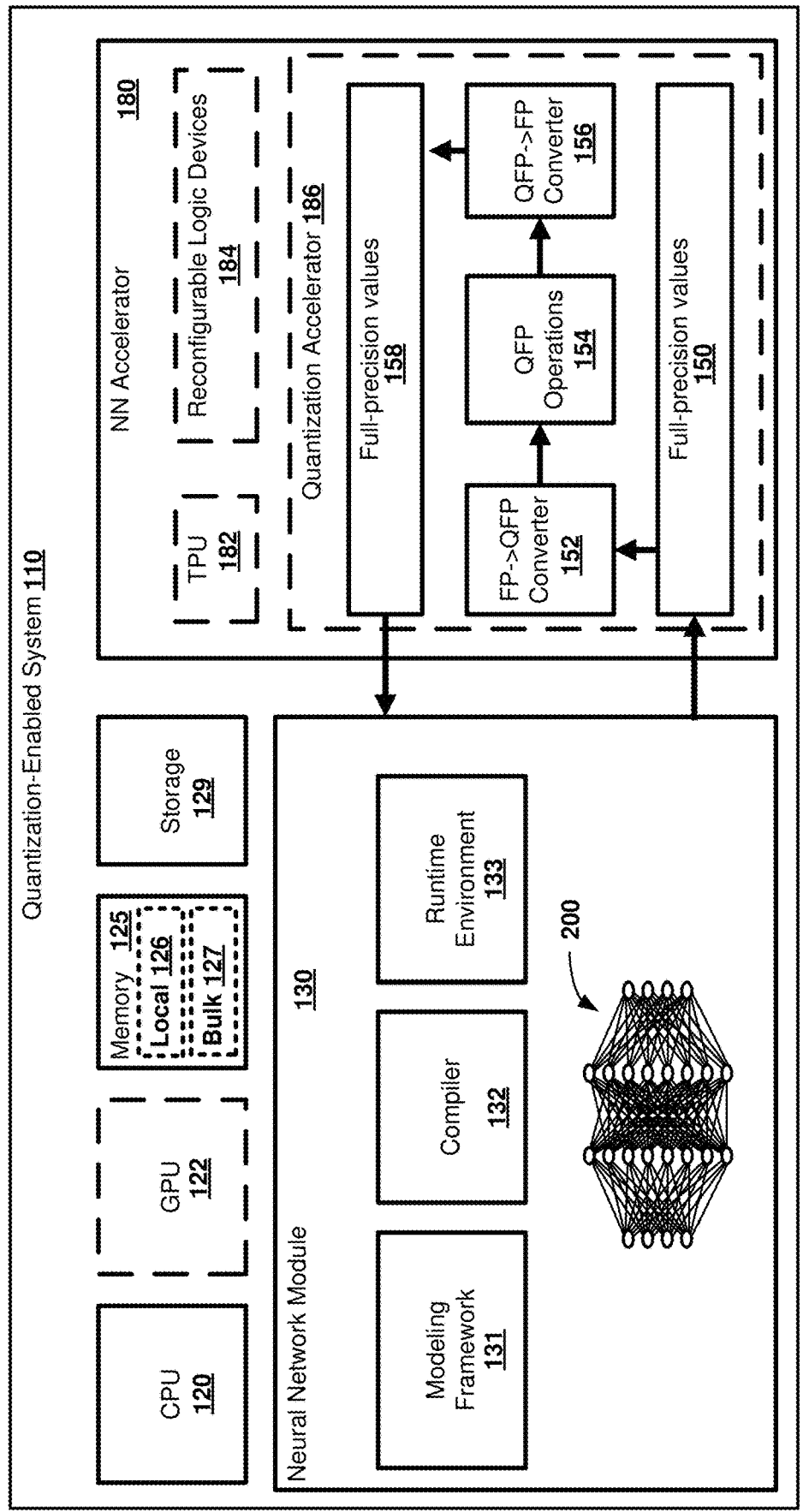
FIG. 1 is a block diagram of a quantization-enabled system for performing activation compression, as can be implemented in certain examples of the disclosed technology.

This disclosure is set forth in the context of representative embodiments that are not intended to be limiting in any way.

As used in this application the singular forms "a," "an," and "the" include the plural forms unless the context clearly dictates otherwise. Additionally, the term "includes" means "comprises." Further, the term "coupled" encompasses mechanical, electrical, magnetic, optical, as well as other practical ways of coupling or linking items together, and does not exclude the presence of intermediate elements between the coupled items. Furthermore, as used herein, the term "and/or" means any one item or combination of items in the phrase.

The systems, methods, and apparatus described herein should not be construed as being limiting in any way. Instead, this disclosure is directed toward all novel and non-obvious features and aspects of the various disclosed embodiments, alone and in various combinations and subcombinations with one another. The disclosed systems, methods, and apparatus are not limited to any specific aspect or feature or combinations thereof, nor do the disclosed things and methods require that any one or more specific advantages be present or problems be solved. Furthermore, any features or aspects of the disclosed embodiments can be used in various combinations and subcombinations with one another.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed things and methods can be used in conjunction with other things and methods. Additionally, the description sometimes uses terms like "produce," "generate," "display," "receive," "verify," "execute," "perform," "convert," and "initiate" to describe the disclosed methods. These terms are high-level descriptions of the actual operations that are performed. The actual operations that correspond to these terms will vary depending on the particular implementation and are readily discernible by one of ordinary skill in the art.

Theories of operation, scientific principles, or other theoretical descriptions presented herein in reference to the apparatus or methods of this disclosure have been provided for the purposes of better understanding and are not intended to be limiting in scope. The apparatus and methods in the appended claims are not limited to those apparatus and methods that function in the manner described by such theories of operation.

Any of the disclosed methods can be implemented as computer-executable instructions stored on one or more computer-readable media (e.g., computer-readable media, such as one or more optical media discs, volatile memory components (such as DRAM or SRAM), or nonvolatile memory components (such as hard drives)) and executed on a computer (e.g., any commercially available computer, including smart phones or other mobile devices that include computing hardware). Any of the computer-executable instructions for implementing the disclosed techniques, as well as any data created and used during implementation of the disclosed embodiments, can be stored on one or more computer-readable media (e.g., computer-readable storage media). The computer-executable instructions can be part of, for example, a dedicated software application or a software application that is accessed or downloaded via a web browser or other software application (such as a remote computing application). Such software can be executed, for example, on a single local computer or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in C, C++, Java, or any other suitable programming language. Certain details of suitable computers and hardware are well-known and need not be set forth in detail in this disclosure.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

II. Overview of Quantized Artificial Neural Networks

Artificial Neural Networks (ANNs or as used throughout herein, "NNs") are applied to a number of applications in Artificial Intelligence and Machine Learning including image recognition, speech recognition, search engines, and other suitable applications. The processing for these applications may take place on individual devices such as personal computers or cell phones, but it may also be performed in large datacenters. At the same time, hardware accelerators that can be used with NNs include specialized NN processing units, such as tensor processing units (TPUs) and Field Programmable Gate Arrays (FPGAs) programmed to accelerate neural network processing. Such hardware devices are being deployed in consumer devices as well as in data centers due to their flexible nature and low power consumption per unit computation.

Traditionally NNs have been trained and deployed using single-precision floating-point (32-bit floating-point or float32 format). However, it has been shown that lower precision floating-point formats, such as 16-bit floating-point (float16) or fixed-point formats can be used to perform inference operations with minimal loss in accuracy. On specialized hardware, such as FPGAs, reduced precision formats can greatly improve the latency and throughput of DNN processing.

Numbers represented in normal-precision floating-point format (e.g., a floating-point number expresses in a 16-bit floating-point format, a 32-bit floating-point format, a 64-bit floating-point format, or an 80-bit floating-point format) can be converted to quantized-precision format numbers may allow for performance benefits in performing operations. In particular, NN weights and activation values can be represented in a lower-precision quantized format with an acceptable level of error introduced. Examples of lower-precision quantized formats include formats having a reduced bit width (including by reducing the number of bits used to represent a number's mantissa or exponent) and block floating-point formats where two or more numbers share the same single exponent.

One of the characteristics of computation on an FPGA device is that it typically lacks hardware floating-point support. Floating-point operations may be performed at a penalty using the flexible logic, but often the amount of logic needed to support floating-point is prohibitive in FPGA implementations. Some newer FPGAs have been developed that do support floating-point computation, but even on these the same device can produce twice as many computational outputs per unit time as when it is used in an integer mode. Typically, NNs are created with floating-point computation in mind, but when an FPGA is targeted for NN processing it would be beneficial if the neural network could be expressed using integer arithmetic. Examples of the disclosed technology include hardware implementations of block floating-point (BFP), including the use of BFP in NN, FPGA, and other hardware environments.

A typical floating-point representation in a computer system consists of three parts: sign (s), exponent (e), and mantissa (m). The sign indicates if the number is positive or negative. The exponent and mantissa are used as in scientific notation:

$$\text{Value} = s \times m \times 2^e \quad \text{(Eq. 1)}$$

Any number may be represented, within the precision limits of the mantissa. Since the exponent scales the mantissa by powers of 2, just as the exponent does by powers of 10 in scientific notation, the magnitudes of very large numbers may be represented. The precision of the representation is determined by the precision of the mantissa. Typical floating-point representations use a mantissa of 10 (float 16), 24 (float 32), or 53 (float64) bits in width. An integer with magnitude greater than $2^{53}$ can be approximated in a float64 floating-point format, but it will not be represented exactly because there are not enough bits in the mantissa. A similar effect can occur for arbitrary fractions where the fraction is represented by bits of the mantissa that take on the value of negative powers of 2. There are many fractions that cannot be exactly represented because they are irrational in a binary number system. More exact representations are possible in both situations, but they may require the mantissa to contain more bits. Ultimately, an infinite number of mantissa bits are required to represent some numbers exactly $$\left( e.g., \frac{1}{3} = 0.\overline{3}; \frac{22}{7} = 3.\overline{142857} \right).$$

The 10-bit (half precision float), 24-bit (single precision float), and 53-bit (double precision float) mantissa limits are common compromises of mantissa storage requirements versus representation precision in general-purpose computers.

With block floating-point formats, a group of two or more numbers use a single shared exponent with each number still having its own sign and mantissa. In some examples, the shared exponent is chosen to be the largest exponent of the original floating-point values. For purposes of the present disclosure, the term block floating-point (BFP) means a number system in which a single exponent is shared across two or more values, each of which is represented by a sign and mantissa pair (whether there is an explicit sign bit, or the mantissa itself is signed). In some examples, all values of one or more rows or columns of a matrix or vector, or all values of a matrix or vector, can share a common exponent. In other examples, the BFP representation may be unsigned. In some examples, some but not all of the elements in a matrix or vector BFP representation may include numbers represented as integers, floating-point numbers, fixed point numbers, symbols, or other data formats mixed with numbers represented with a sign, mantissa, and exponent. In some examples, some or all of the elements in a matrix or vector BFP representation can include complex elements having two or more parts, for example: complex numbers with an imaginary component (a+bi, where i=$\sqrt{-1}$); fractions including a numerator and denominator, in polar coordinates (r, θ), or other multi-component element.

Parameters of particular BFP formats can be selected for a particular implementation to tradeoff precision and storage requirements. For example, rather than storing an exponent with every floating-point number, a group of numbers can share the same exponent. To share exponents while maintaining a high level of accuracy, the numbers should have close to the same magnitude, since differences in magnitude are expressed in the mantissa. If the differences in magnitude are too great, the mantissa will overflow for the large values, or may be zero ("underflow") for the smaller values. Depending on a particular application, some amount of overflow and/or underflow may be acceptable.

The size of the mantissa can be adjusted to fit a particular application. This can affect the precision of the number being represented, but potential gains are realized from a reduced representation size. For example, a normal single-precision float has a size of four bytes, but for certain implementations of the disclosed technology, only two bytes are used to represent the sign and mantissa of each value. In some implementations, the sign and mantissa of each value can be represented in a byte or less.

In certain examples of the disclosed technology, the representation expressed above is used to derive the original number from the representation, but only a single exponent is stored for a group of numbers, each of which is represented by a signed mantissa. Each signed mantissa can be represented by two bytes or less, so in comparison to four-byte floating-point, the memory storage savings is about 2×. Further, the memory bandwidth requirements of loading and storing these values are also approximately one-half that of normal floating-point.

Neural network operations are used in many artificial intelligence operations. Often, the bulk of the processing operations performed in implementing a neural network is in performing Matrix×Matrix or Matrix×Vector multiplications or convolution operations. Such operations are compute- and memory-bandwidth intensive, where the size of a matrix may be, for example, 1000×1000 elements (e.g., 1000×1000 numbers, each including a sign, mantissa, and exponent) or larger and there are many matrices used. As discussed herein, BFP techniques can be applied to such operations to reduce the demands for computation as well as memory bandwidth in a given system, whether it is an FPGA, CPU, or another hardware platform. As used herein, the use of the term "element" herein refers to a member of such a matrix or vector.

As used herein, the term "tensor" refers to a multi-dimensional array that can be used to represent properties of a NN and includes one-dimensional vectors as well as two-, three-, four-, or larger dimension matrices. As used in this disclosure, tensors do not require any other mathematical properties unless specifically stated.

As used herein, the term "normal-precision floating-point" refers to a floating-point number format having a mantissa, exponent, and optionally a sign and which is natively supported by a native or virtual CPU. Examples of normal-precision floating-point formats include, but are not limited to, IEEE 754 standard formats such as 16-bit, 32-bit, 64-bit, or to other processors supported by a processor, such as Intel AVX, AVX2, IA32, x86_64, or 80-bit floating-point formats.

As used herein, the term "lossy mantissa" refers to a mantissa that represents a higher-precision mantissa as a discrete set of lower-precision mantissa values. For example, for a four-bit number having a sign bit and three mantissa bits, the 3-bit mantissa (which can represent 8 values, for example, the set $\{0, 1, 2, 3, 4, 5, 6, 7\}$ may be converted to a lossy mantissa having discrete sets of mantissa values, for example, any one of the sets: $\{0, 1, 3, 7\}$, $\{0, 1, 7\}$, or $\{0, 7\}$, depending on a selected lossy mantissa scheme. The underlying representation of the lossy mantissa may vary. For the preceding three sets, an example set of respective binary representations is $\{00, 01, 10, 11\}$; $\{00, 10, 11\}$; and $\{0, 1\}$; respectively.

A used herein, the term "non-uniform mantissa" refers to a property of certain lossy mantissas where at least one of the values being represented are not uniformly distributed. For the example in the preceding paragraph, the 3-bit mantissa is uniform, as every value is one unit apart. Two of the three sets of lossy mantissas are non-uniformly spaced, being distributed at different intervals: 1, 2, and 4 units apart for the first set; 1 or 6 units apart for the second set, and 7 units apart for the third set. The term non-uniform mantissa includes not only lossy mantissas that are non-uniformly spaced, but also lower-precision, lossy mantissa values that are non-uniformly mapped from a higher-precision mantissa. For example, the higher-precision set $\{0, 1, 2, 3, 4, 5, 6, 7\}$ can be non-uniformly mapped as follows: $\{0\}=>\{0\}$; $\{1, 2\}=>\{1\}$; $\{3, 4, 5, 6\}=>\{3\}$; $\{7\}=>\{7\}$. As another example, this same higher-precision set can be non-uniformly mapped another way: $\{0\}=>\{0\}$; $\{1, 2, 3, 4, 5, 6\}=>\{1\}$; $\{7\}=>\{7\}$. As another example, this same higher-precision set can be non-uniformly mapped another way: higher-precision set can be non-uniformly mapped another way: $\{0\}=>\{0\}$; $\{1, 2, 3, 4, 5, 6, 7\}=>\{7\}$. This third way features uniformly spaced (by 7 units), but non-uniformly mapped, mantissa values.

A given number can be represented using different precision (e.g., different quantized precision) formats. For example, a number can be represented in a higher precision format (e.g., float32) and a lower precision format (e.g., float16). Lowering the precision of a number can include reducing the number of bits used to represent the mantissa or exponent of the number. Additionally, lowering the precision of a number can include reducing the range of values that can be used to represent an exponent of the number, such as when multiple numbers share a common exponent. Similarly, increasing the precision of a number can include increasing the number of bits used to represent the mantissa or exponent of the number. Additionally, increasing the precision of a number can include increasing the range of values that can be used to represent an exponent of the number, such as when a number is separated from a group of numbers that shared a common exponent. As used herein, converting a number from a higher precision format to a lower precision format may be referred to as down-casting or quantizing the number. Converting a number from a lower precision format to a higher precision format may be referred to as up-casting or dequantizing the number.

As used herein, the term "quantized-precision floating-point" refers to a floating-point number format where two or more values of a tensor have been modified to have a lower precision than when the values are represented in normal-precision floating-point. In particular, many examples of quantized-precision floating-point representations include block floating-point formats, where two or more values of the tensor are represented with reference to a common exponent. The quantized-precision floating-point number can be generated by selecting a common exponent for two, more, or all elements of a tensor and shifting mantissas of individual elements to match the shared, common exponent. In some examples, groups of elements within a tensor can share a common exponent on, for example, a per-row, per-column, per-tile, or other basis.

In one example of the disclosed technology, a neural network accelerator is configured to performing training operations for layers of a neural network, including forward propagation and back propagation. The values of one or more of the neural network layers can be expressed in a quantized format, that has lower precision than normal-precision floating-point formats. For example, block floating-point formats can be used to accelerate computations performed in training and inference operations using the neural network accelerator. Use of quantized formats can improve neural network processing by, for example, allowing for faster hardware, reduced memory overhead, simpler hardware design, reduced energy use, reduced integrated circuit area, cost savings and other technological improvements. It is often desirable that operations be performed to mitigate noise or other inaccuracies introduced by using lower-precision quantized formats. Further, portions of neural network training, such as temporary storage of activation values, can be improved by compressing a portion of these values (e.g., for an input, hidden, or output layer of a neural network), either from normal-precision floating-point or from a first block floating-point, to a lower precision number format having lossy or non-uniform mantissas. The activation values can be later retrieved and dequantized for use during, for example, back propagation during the training phase.

An input tensor for the given layer can be converted from a normal-precision floating-point format to a quantized-precision floating-point format. A tensor operation can be performed using the converted input tensor having lossy or non-uniform mantissas. A result of the tensor operation can be converted from the block floating-point format to the normal-precision floating-point format. The tensor operation can be performed during a forward-propagation mode or a back-propagation mode of the neural network. For example, during a back-propagation mode, the input tensor can be an output error term from a layer adjacent to (e.g., following) the given layer or weights of the given layer. As another example, during a forward-propagation mode, the input tensor can be an output term from a layer adjacent to (e.g., preceding) the given layer or weights of the given layer. The converted result can be used to generate an output tensor of the layer of the neural network, where the output tensor is in normal-precision floating-point format. In this manner, the neural network accelerator can potentially be made smaller and more efficient than a comparable accelerator that uses only a normal-precision floating-point format. A smaller and more efficient accelerator may have increased computational performance and/or increased energy efficiency. Additionally, the neural network accelerator can potentially have increased accuracy compared to an accelerator that uses only a quantized-precision floating-point format. By increasing the accuracy of the accelerator, a convergence time for training may be decreased and the accelerator may be more accurate when classifying inputs to the neural network. Reducing the computational complexity of using the models can potentially decrease the time to extract a feature during inference, decrease the time for adjustment during training, and/or reduce energy consumption during training and/or inference.

III. Example Architectures for Implementing Activation Compression with Non-Uniform Mantissa Block Floating-Point FIG. 1 is a block diagram 100 outlining an example quantization-enabled system 110 as can be implemented in certain examples of the disclosed technology, including for use in activation compression with non-uniform mantissa floating-point. As shown in FIG. 1, the quantization-enabled system 110 can include a number of hardware resources including general-purpose processors 120 and special-purpose processors such as graphics processing units 122 and neural network accelerator 180. The processors are coupled to memory 125 and storage 129, which can include volatile or non-volatile memory devices. The processors 120 and 122 execute instructions stored in the memory or storage in order to provide a neural network module 130. The neural network module 130 includes software interfaces that allow the system to be programmed to implement various types of neural networks. For example, software functions can be provided that allow applications to define neural networks including weights, biases, activation functions, node values, and interconnections between layers of a neural network. Additionally, software functions can be used to define state elements for recurrent neural networks. The neural network module 130 can further provide utilities to allow for training and retraining of a neural network implemented with the module. Values representing the neural network module are stored in memory or storage and are operated on by instructions executed by one of the processors. The values stored in memory or storage can be represented using normal-precision floating-point and/or quantized floating-point values, including floating-point values having lossy or non-uniform mantissas.

In some examples, proprietary or open source libraries or frameworks are provided to a programmer to implement neural network creation, training, and evaluation. Examples of such libraries include TensorFlow, Microsoft Cognitive Toolkit (CNTK), Caffe, Theano, and Keras. In some examples, programming tools such as integrated development environments provide support for programmers and users to define, compile, and evaluate NNs.

The neural network accelerator 180 can be implemented as a custom or application-specific integrated circuit (e.g., including a system-on-chip (SoC) integrated circuit), as a field programmable gate array (FPGA) or other reconfigurable logic, or as a soft processor virtual machine hosted by a physical, general-purpose processor. The neural network accelerator 180 can include a tensor processing unit 182, reconfigurable logic devices 184, and/or one or more neural processing cores (such as the quantization accelerator 186). The quantization accelerator 186 can be configured in hardware, software, or a combination of hardware and software. As one example, the quantization accelerator 186 can be configured and/or executed using instructions executable on the tensor processing unit 182. As another example, the quantization accelerator 186 can be configured by programming reconfigurable logic blocks 184. As another example, the quantization accelerator 186 can be configured using hard-wired logic gates of the neural network accelerator 180.

The quantization accelerator 186 can be programmed to execute a subgraph, an individual layer, or a plurality of layers of a neural network. For example, the quantization accelerator 186 can be programmed to perform operations for all or a portion of a layer of a NN. The quantization accelerator 186 can access a local memory used for storing weights, biases, input values, output values, forget values, state values, and so forth. The quantization accelerator 186 can have many inputs, where each input can be weighted by a different weight value. For example, the quantization accelerator 186 can produce a dot product of an input tensor and the programmed input weights for the quantization accelerator 186. In some examples, the dot product can be adjusted by a bias value before it is used as an input to an activation function. The output of the quantization accelerator 186 can be stored in the local memory, where the output value can be accessed and sent to a different NN processor core and/or to the neural network module 130 or the memory 125, for example. Intermediate values in the quantization accelerator can often be stored in a smaller or more local memory, while values that may not be needed until later in a training process can be stored in a "bulk memory" a larger, less local memory (or storage device, such as on an SSD (solid state drive) or hard drive). For example, during training forward propagation, once activation values for a next layer in the NN have been calculated, those values may not be accessed until for propagation through all layers has completed. Such activation values can be stored in such a bulk memory.

The neural network accelerator 180 can include a plurality 110 of quantization accelerators 186 that are connected to each other via an interconnect (not shown). The interconnect can carry data and control signals between individual quantization accelerators 186, a memory interface (not shown), and an input/output (I/O) interface (not shown). The interconnect can transmit and receive signals using electrical, optical, magnetic, or other suitable communication technology and can provide communication connections arranged according to a number of different topologies, depending on a particular desired configuration. For example, the interconnect can have a crossbar, a bus, a point-to-point bus, or other suitable topology. In some examples, any one of the plurality of quantization accelerators 186 can be connected to any of the other cores, while in other examples, some cores are only connected to a subset of the other cores. For example, each core may only be connected to a nearest 4, 8, or 10 neighboring cores. The interconnect can be used to transmit input/output data to and from the quantization accelerators 186, as well as transmit control signals and other information signals to and from the quantization accelerators 186. For example, each of the quantization accelerators 186 can receive and transmit semaphores that indicate the execution status of operations currently being performed by each of the respective quantization accelerators 186. Further, matrix and vector values can be shared between quantization accelerators 186 via the interconnect. In some examples, the interconnect is implemented as wires connecting the quantization accelerators 186 and memory system, while in other examples, the core interconnect can include circuitry for multiplexing data signals on the interconnect wire(s), switch and/or routing components, including active signal drivers and repeaters, or other suitable circuitry. In some examples of the disclosed technology, signals transmitted within and to/from neural network accelerator 180 are not limited to full swing electrical digital signals, but the neural network accelerator 180 can be configured to include differential signals, pulsed signals, or other suitable signals for transmitting data and control signals.

In some examples, the quantization-enabled system 110 can include an optional quantization emulator that emulates functions of the neural network accelerator 180. The neural network accelerator 180 provides functionality that can be used to convert data represented in full precision floating-point formats in the neural network module 130 into quantized format values. The neural network accelerator 180 can also perform operations using quantized format values. Such functionality will be discussed in further detail below.

The neural network module 130 can be used to specify, train, and evaluate a neural network model using a tool flow that includes a hardware-agnostic modelling framework 131 (also referred to as a native framework or a machine learning execution engine), a neural network compiler 132, and a neural network runtime environment 133. The memory includes computer-executable instructions for the tool flow including the modelling framework 131, the neural network compiler 132, and the neural network runtime environment 133. The tool flow can be used to generate neural network data 200 representing all or a portion of the neural network model, such as the neural network model discussed below regarding FIG. 2. It should be noted that while the tool flow is described as having three separate tools (131, 132, and 133), the tool flow can have fewer or more tools in various examples. For example, the functions of the different tools (131, 132, and 133) can be combined into a single modelling and execution environment. In other examples, where a neural network accelerator is deployed, such a modeling framework may not be included.

The neural network data 200 can be stored in the memory 125, which can include local memory 126, which is typically implemented as static read only memory (SRAM), embedded dynamic random access memory (eDRAM), in latches or flip-flops in a register file, in a block RAM, or other suitable structure, and bulk memory 127, which is typically implemented in memory structures supporting larger, but often slower access than the local memory 126. For example, the bulk memory may be off-chip DRAM, network accessible RAM, SSD drives, hard drives, or network-accessible storage. Depending on a particular memory technology available, other memory structures, including the foregoing structures recited for the local memory, may be used to implement bulk memory. The neural network data 200 can be represented in one or more formats. For example, the neural network data 200 corresponding to a given neural network model can have a different format associated with each respective tool of the tool flow. Generally, the neural network data 200 can include a description of nodes, edges, groupings, weights, biases, activation functions, and/or tensor values. As a specific example, the neural network data 200 can include source code, executable code, metadata, configuration data, data structures and/or files for representing the neural network model.

The modelling framework 131 can be used to define and use a neural network model. As one example, the modelling framework 131 can include pre-defined APIs and/or programming primitives that can be used to specify one or more aspects of the neural network model. The pre-defined APIs can include both lower-level APIs (e.g., activation functions, cost or error functions, nodes, edges, and tensors) and higher-level APIs (e.g., layers, convolutional neural networks, recurrent neural networks, linear classifiers, and so forth). "Source code" can be used as an input to the modelling framework 131 to define a topology of the graph of a given neural network model. In particular, APIs of the modelling framework 131 can be instantiated and interconnected within the source code to specify a complex neural network model. A data scientist can create different neural network models by using different APIs, different numbers of APIs, and interconnecting the APIs in different ways.

In addition to the source code, the memory 125 can also store training data. The training data includes a set of input data for applying to the neural network model 200 and a desired output from the neural network model for each respective dataset of the input data. The modelling framework 131 can be used to train the neural network model with the training data. An output of the training is the weights and biases that are associated with each node of the neural network model. After the neural network model is trained, the modelling framework 131 can be used to classify new data that is applied to the trained neural network model. Specifically, the trained neural network model uses the weights and biases obtained from training to perform classification and recognition tasks on data that has not been used to train the neural network model. The modelling framework 131 can use the CPU 120 and the special-purpose processors (e.g., the GPU 122 and/or the neural network accelerator 180) to execute the neural network model with increased performance as compare with using only the CPU 120. In some examples, the performance can potentially achieve real-time performance for some classification tasks.

The compiler 132 analyzes the source code and data (e.g., the examples used to train the model) provided for a neural network model and transforms the model into a format that can be accelerated on the neural network accelerator 180, which will be described in further detail below. Specifically, the compiler 132 transforms the source code into executable code, metadata, configuration data, and/or data structures for representing the neural network model and memory as neural network data 200. In some examples, the compiler 132 can divide the neural network model into portions (e.g., neural network 200) using the CPU 120 and/or the GPU 122) and other portions (e.g., a subgraph, an individual layer, or a plurality of layers of a neural network) that can be executed on the neural network accelerator 180. The compiler 132 can generate executable code (e.g., runtime modules) for executing NNs assigned to the CPU 120 and for communicating with a subgraph, an individual layer, or a plurality of layers of a neural network assigned to the accelerator 180. The compiler 132 can generate configuration data for the accelerator 180 that is used to configure accelerator resources to evaluate the subgraphs assigned to the optional accelerator 180. The compiler 132 can create data structures for storing values generated by the neural network model during execution and/or training and for communication between the CPU 120 and the accelerator 180. The compiler 132 can generate metadata that can be used to identify subgraphs, edge groupings, training data, and various other information about the neural network model during runtime. For example, the metadata can include information for interfacing between the different subgraphs or other portions of the neural network model.

The runtime environment 133 provides an executable environment or an interpreter that can be used to train the neural network model during a training mode and that can be used to evaluate the neural network model in training, inference, or classification modes. During the inference mode, input data can be applied to the neural network model inputs and the input data can be classified in accordance with the training of the neural network model. The input data can be archived data or real-time data.

The runtime environment 133 can include a deployment tool that, during a deployment mode, can be used to deploy or install all or a portion of the neural network to neural network accelerator 180. The runtime environment 133 can further include a scheduler that manages the execution of the different runtime modules and the communication between the runtime modules and the neural network accelerator 180. Thus, the runtime environment 133 can be used to control the flow of data between nodes modeled on the neural network module 130 and the neural network accelerator 180.

In one example, the neural network accelerator 180 receives and returns normal-precision values 150 from the neural network module 130. As illustrated in FIG. 1, the quantization accelerator 186 can perform a bulk of its operations using quantized floating-point and an interface between the quantization accelerator 186 and the neural network module 130 can use full-precision values for communicating information between the modules. The normal-precision values can be represented in 16-, 32-, 64-bit, or other suitable floating-point format. For example, a portion of values representing the neural network can be received, including edge weights, activation values, or other suitable parameters for quantization. The normal-precision values 150 are provided to a normal-precision floating-point to quantized floating-point converter 152, which converts the normal-precision value into quantized values. Quantized floating-point operations 154 can then be performed on the quantized values. The quantized values can then be converted back to a normal-floating-point format using a quantized floating-point to normal-floating-point converter 156 which produces normal-precision floating-point values. As a specific example, the quantization accelerator 186 can be used to accelerate a given layer of a neural network, and the vector-vector, matrix-vector, matrix-matrix, and convolution operations can be performed using quantized floating-point operations and less compute-intensive operations (such as adding a bias value or calculating an activation function) can be performed using normal floating-point precision operations. Other examples of conversions that can be performed are converting quantized and normal-precision floating-point values to normal floating-point or block floating-point values that have lossy or non-uniform mantissa values. For example, conversion to block floating-point format with non-uniform mantissas can be performed to compress activation values, and a conversion from block floating-point format with non-uniform mantissas to normal-precision floating-point or block floating-point can be performed when retrieving compressed activation values for later use, for example, in back propagation.

The conversions between normal floating-point and quantized floating-point performed by the converters 152 and 156 are typically performed on sets of numbers represented as vectors or multi-dimensional matrices. In some examples, additional normal-precision operations 158, including operations that may be desirable in particular neural network implementations can be performed based on normal-precision formats including adding a bias to one or more nodes of a neural network, applying a hyperbolic tangent function or other such sigmoid function, or rectification functions (e.g., ReLU operations) to normal-precision values that are converted back from the quantized floating-point format.

In some examples, the quantized values are used and stored only in the logic gates and internal memories of the neural network accelerator 180, and the memory 125 and storage 129 store only normal floating-point values. For example, the neural network accelerator 180 can quantize the inputs, weights, and activations for a neural network model that are received from the neural network model 130 and can de-quantize the results of the operations that are performed on the neural network accelerator 180 before passing the values back to the neural network model 130. Values can be passed between the neural network model 130 and the neural network accelerator 180 using the memory 125, the storage 129, or an input/output interface (not shown). In other examples, an emulator provides full emulation of the quantization, including only storing one copy of the shared exponent and operating with reduced mantissa widths. Some results may differ over versions where the underlying operations are performed in normal floating-point. For example, certain examples can check for underflow or overflow conditions for a limited, quantized bit width (e.g., 3-, 4-, or 5-bit wide mantissas).

The bulk of the computational cost of DNNs is in vector-vector, matrix-vector, and matrix-matrix multiplications and/or convolutions. These operations are quadratic in input sizes while operations such as bias add and activation functions are linear in input size. Thus, in some examples, quantization is only applied to matrix-vector multiplication operations, which is implemented on the neural network accelerator 180. In such examples, all other operations are done in a normal-precision format, such as float16. Thus, from the user or programmer's perspective, the quantization-enabled system 110 accepts and outputs normal-precision float16 values from/to the neural network module 130 and output float16 format values. All conversions to and from block floating-point format can be hidden from the programmer or user. In some examples, the programmer or user may specify certain parameters for quantization operations. In other examples, quantization operations can take advantage of block floating-point format to reduce computation complexity, as discussed below regarding FIG. 3.

The neural network accelerator 180 is used to accelerate evaluation and/or training of a neural network graph or subgraphs, typically with increased speed and reduced latency that is not realized when evaluating the subgraph using only the CPU 120 and/or the GPU 122. In the illustrated example, the accelerator includes a Tensor Processing Unit (TPU) 182, reconfigurable logic devices 184 (e.g., contained in one or more FPGAs or a programmable circuit fabric), and/or a quantization accelerator 186, however any suitable hardware accelerator can be used that models neural networks. The accelerator 180 can include configuration logic which provides a soft CPU. The soft CPU supervises operation of the accelerated graph or subgraph on the accelerator 180 and can manage communications with the neural network module 130. The soft CPU can also be used to configure logic and to control loading and storing of data from RAM on the accelerator, for example in block RAM within an FPGA.

In some examples, parameters of the neural network accelerator 180 can be programmable. The neural network accelerator 180 can be used to prototype training, inference, or classification of all or a portion of the neural network model 200. For example, quantization parameters can be selected based on accuracy or performance results obtained by prototyping the network within neural network accelerator 180. After a desired set of quantization parameters is selected, a quantized model can be programmed into the accelerator 180 for performing further operations.

The compiler 132 and the runtime 133 provide a fast interface between the neural network module 130 and the neural network accelerator 180. In effect, the user of the neural network model may be unaware that a portion of the model is being accelerated on the provided accelerator. For example, node values are typically propagated in a model by writing tensor values to a data structure including an identifier. The runtime 133 associates subgraph identifiers with the accelerator, and provides logic for translating the message to the accelerator, transparently writing values for weights, biases, and/or tensors to the neural network accelerator 180 without program intervention. Similarly, values that are output by the neural network accelerator 180 may be transparently sent back to the neural network module 130 with a message including an identifier of a receiving node at the server and a payload that includes values such as weights, biases, and/or tensors that are sent back to the overall neural network model.

Figure 2:
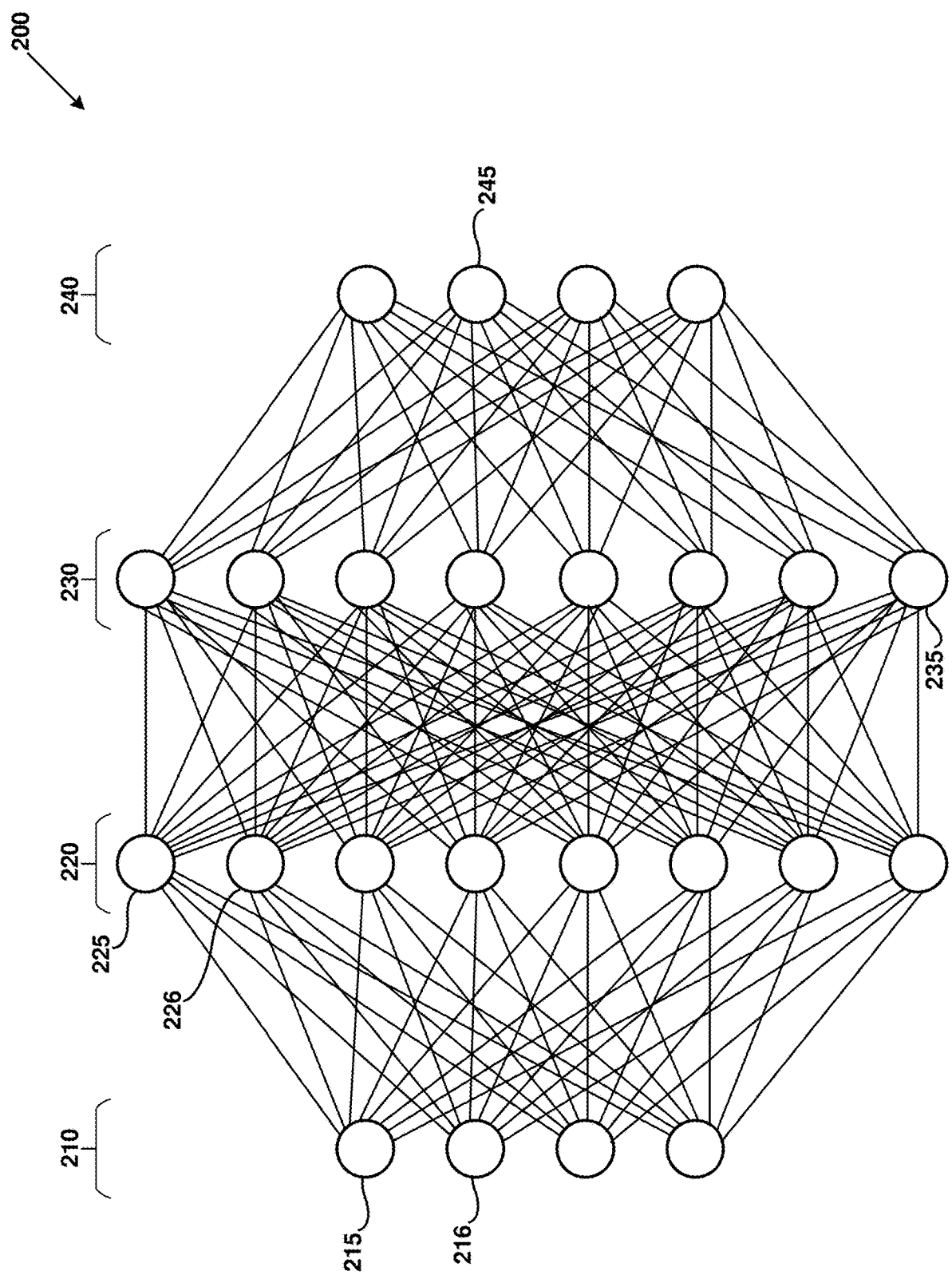
FIG. 2 is a diagram depicting an example of a deep neural network, as can be modeled using certain example methods and apparatus disclosed herein.

FIG. 2 illustrates a simplified topology of a deep neural network (DNN) 200 that can be used to perform neural network applications, such as enhanced image processing, using disclosed BFP implementations. One or more processing layers can be implemented using disclosed techniques for quantized and BFP matrix/vector operations, including the use of one or more of a plurality of neural network quantization accelerators 186 in the quantization-enabled system 110 described above. It should be noted that applications of the neural network implementations disclosed herein are not limited to DNNs but can also be used with other types of neural networks, such as convolutional neural networks (CNNs), including implementations having Long Short Term Memory (LSTMs) or gated recurrent units (GRUs), or other suitable artificial neural networks that can be adapted to use BFP methods and apparatus disclosed herein.

The DNN 200 can operate in at least two different modes. Initially, the DNN 200 can be trained in a training mode and then used as a classifier in an inference mode. During the training mode, a set of training data can be applied to inputs of the DNN 200 and various parameters of the DNN 200 can be adjusted so that at the completion of training, the DNN 200 can be used as a classifier. Training includes performing forward propagation of the training input data, calculating a loss (e.g., determining a difference between an output of the DNN and the expected outputs of the DNN), and performing backward propagation through the DNN to adjust parameters (e.g., weights and biases) of the DNN 200. When an architecture of the DNN 200 is appropriate for classifying the training data, the parameters of the DNN 200 will converge and the training can complete. After training, the DNN 200 can be used in the inference mode. Specifically, training or non-training data can be applied to the inputs of the DNN 200 and forward propagated through the DNN 200 so that the input data can be classified by the DNN 200.

As shown in FIG. 2, a first set 210 of nodes (including nodes 215 and 216) form an input layer. Each node of the set 210 is connected to each node in a first hidden layer formed from a second set 220 of nodes (including nodes 225 and 226). A second hidden layer is formed from a third set 230 of nodes, including node 235. An output layer is formed from a fourth set 240 of nodes (including node 245). In example 200, the nodes of a given layer are fully interconnected to the nodes of its neighboring layer(s). In other words, a layer can include nodes that have common inputs with the other nodes of the layer and/or provide outputs to common destinations of the other nodes of the layer. In other examples, a layer can include nodes that have a subset of common inputs with the other nodes of the layer and/or provide outputs to a subset of common destinations of the other nodes of the layer.

During forward propagation, each of the nodes produces an output by applying a weight to each input generated from the preceding node and collecting the weights to produce an output value. In some examples, each individual node can have an activation function ($\sigma$) and/or a bias (b) applied. Generally, an appropriately programmed processor or FPGA can be configured to implement the nodes in the depicted neural network 200. In some example neural networks, an output function $f(n)$ of a hidden combinational node n can produce an output expressed mathematically as:

$$f(n) = \sigma\left(\sum_{i=0\,to\,E-1} w_i x_i + b\right) \quad \text{(Eq. 2)}$$

where $w_i$ is a weight that is applied (multiplied) to an input edge $x_i$, b is a bias value for the node n, $\sigma$ is the activation function of the node n, and E is the number of input edges of the node n. In some examples, the activation function produces a continuous value (represented as a floating-point number) between 0 and 1. In some examples, the activation function produces a binary 1 or 0 value, depending on whether the summation is above or below a threshold.

A given neural network can include thousands of individual nodes and so performing all of the calculations for the nodes in normal-precision floating-point can be computationally expensive. An implementation for a more computationally expensive solution can include hardware that is larger and consumes more energy than an implementation for a less computationally expensive solution. However, performing the operations using quantized floating-point can potentially reduce the computational complexity of the neural network. A simple implementation that uses only quantized floating-point may significantly reduce the computational complexity, but the implementation may have difficulty converging during training and/or correctly classifying input data because of errors introduced by the quantization. However, quantized floating-point implementations disclosed herein can potentially increase an accuracy of some calculations while also providing the benefits of reduced complexity associated with quantized floating-point.

The DNN 200 can include nodes that perform operations in quantized floating-point. As a specific example, an output function $f(n)$ of a hidden combinational node n can produce an output expressed mathematically as:

$$f(n) = \sigma\left(Q^{-1}\left(\sum_{i=0\,to\,E-1} Q(w_i)Q(x_i)\right) + b\right) \quad \text{(Eq. 3)}$$

where $w_i$ is a weight that is applied (multiplied) to an input edge $x_i$, $Q(w_i)$ is the quantized floating-point value of the weight, $Q(x_i)$ is the quantized floating-point value of the input sourced from the input edge $x_i$, $Q^{-1}(\ )$ is the de-quantized representation of the quantized floating-point value of the dot product of the vectors w and x, b is a bias value for the node n, σ is the activation function of the node n, and E is the number of input edges of the node n. The computational complexity can potentially be reduced (as compared with using only normal-precision floating-point values) by performing the dot product using quantized floating-point values, and the accuracy of the output function can potentially be increased by (as compared with using only quantized floating-point values) by the other operations of the output function using normal-precision floating-point values.

Neural networks can be trained and retrained by adjusting constituent values of the output function $f(n)$. For example, by adjusting weights $w_i$ or bias values b for a node, the behavior of the neural network is adjusted by corresponding changes in the networks output tensor values. For example, a cost function C(w, b) can be used during back propagation to find suitable weights and biases for the network, where the cost function can be described mathematically as:

$$C(w, b) = \frac{1}{2n}\sum_{x}\|y(x) - a\|^2 \quad \text{(Eq. 4)}$$

where w and b represent all weights and biases, n is the number of training inputs, a is a vector of output values from the network for an input vector of training inputs x. By adjusting the network weights and biases, the cost function C can be driven to a goal value (e.g., to zero (0)) using various search techniques, for examples, stochastic gradient descent. The neural network is said to converge when the cost function C is driven to the goal value. Similar to the output function $f(n)$, the cost function can be implemented using quantized-precision computer arithmetic. For example, the vector operations can be performed using quantized floating-point values and operations, and the non-vector operations can be performed using normal-precision floating-point values.

Examples of suitable applications for such neural network BFP implementations include, but are not limited to: performing image recognition, performing speech recognition, classifying images, translating speech to text and/or to other languages, facial or other biometric recognition, natural language processing, automated language translation, query processing in search engines, automatic content selection, analyzing email and other electronic documents, relationship management, biomedical informatics, identifying candidate biomolecules, providing recommendations, or other classification and artificial intelligence tasks.

A network accelerator (such as the network accelerator 180 in FIG. 1) can be used to accelerate the computations of the DNN 200. As one example, the DNN 200 can be partitioned into different subgraphs or network layers that can be individually accelerated. As a specific example, each of the layers 210, 220, 230, and 240 can be a subgraph or layer that is accelerated, with the same or with different accelerators. The computationally expensive calculations of the layer can be performed using quantized floating-point and the less expensive calculations of the layer can be performed using normal-precision floating-point. Values can be passed from one layer to another layer using normal-precision floating-point. By accelerating a group of computations for all nodes within a layer, some of the computations can be reused and the computations performed by the layer can be reduced compared to accelerating individual nodes.

In some examples, a set of parallel multiply-accumulate (MAC) units in each convolutional layer can be used to speed up the computation. Also, parallel multiplier units can be used in the fully-connected and dense-matrix multiplication stages. A parallel set of classifiers can also be used. Such parallelization methods have the potential to speed up the computation even further at the cost of added control complexity.

As will be readily understood to one of ordinary skill in the art having the benefit of the present disclosure, the application of neural network implementations can be used for different aspects of using neural networks, whether alone or in combination or subcombination with one another. For example, disclosed implementations can be used to implement neural network training via gradient descent and/or back propagation operations for a neural network. Further, disclosed implementations can be used for evaluation of neural networks.

IV. Example Quantized Block Floating-Point Formats

Figure 3:
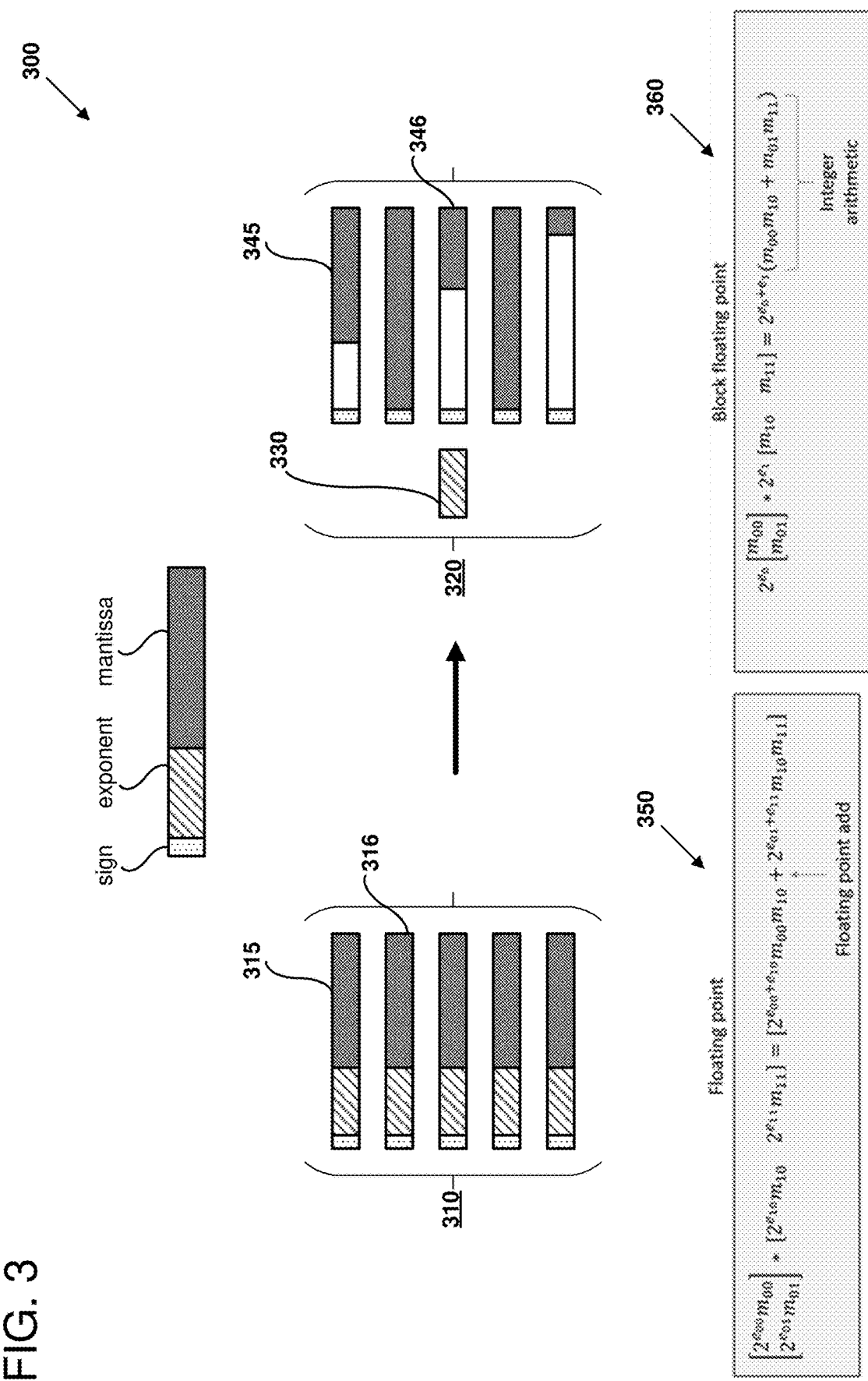
FIG. 3 is a diagram depicting certain aspects of converting a normal floating-point format to a quantized floating-point format, as can be performed in certain examples of the disclosed technology.

FIG. 3 is a diagram 300 illustrating an example of converting a normal floating-point format to a quantized, block floating-point format, as can be used in certain examples of the disclosed technology. For example, input tensors for a neural network represented as normal floating-point numbers (for example, in a 32-bit or 16-bit floating-point format) can be converted to the illustrated block floating-point format.

As shown, a number of normal floating-point format numbers 310 are represented such that each number for example number 315 or number 316 include a sign, an exponent, and a mantissa. For example, for IEEE 754 half precision floating-point format, the sign is represented using one bit, the exponent is represented using 5 bits, and the mantissa is represented using 10 bits. When the floating-point format numbers 310 in the neural network model 200 are converted to a set of quantized precision, block floating-point format numbers, there is one exponent value that is shared by all of the numbers of the illustrated set. Thus, as shown, the set of block floating-point numbers 320 are represented by a single exponent value 330, while each of the set of numbers includes a sign and a mantissa. However, since the illustrated set of numbers have different exponent values in the floating-point format, each number's respective mantissa may be shifted such that the same or a proximate number is represented in the quantized format (e.g., shifted mantissas 345 and 346).

Further, as shown in FIG. 3, use of block floating-point format can reduce computational resources required for certain common operations. In the illustrated example, a dot product of two floating-point vectors is illustrated in formal floating-point format (350) and in block floating-point format (360). For numbers represented in the normal-precision floating-point format operation 350, a floating-point addition is required to perform the dot product operation. In a dot product of floating-point vectors, the summation is performed in floating-point which can require shifts to align values with different exponents. On the other hand, for the block floating-point dot product operation 360, the product can be calculated using integer arithmetic to combine mantissa elements as shown. In other words, since the exponent portion can be factored in the block floating-point representation, multiplication and addition of the mantissas can be done entirely with fixed point or integer representations. As a result, large dynamic range for the set of numbers can be maintained with the shared exponent while reducing computational costs by using more integer arithmetic, instead of floating-point arithmetic. In some examples, operations performed by the quantization-enabled system 110 can be optimized to take advantage of block floating-point format.

In some examples, the shared exponent 330 is selected to be the largest exponent from among the original normal-precision numbers in the neural network model 200. In other examples, the shared exponent may be selected in a different manner, for example, by selecting an exponent that is a mean or median of the normal floating-point exponents, or by selecting an exponent to maximize dynamic range of values stored in the mantissas when their numbers are converted to the quantized number format. It should be noted that some bits of the quantized mantissas may be lost if the shared exponent and the value's original floating-point exponent are not the same. This occurs because the mantissa is shifted to correspond to the new, shared exponent.

There are several possible choices for which values in a block floating-point tensor will share an exponent. The simplest choice is for an entire matrix or vector to share an exponent. However, sharing an exponent over a finer granularity can reduce errors because it increases the likelihood of BFP numbers using a shared exponent that is closer to their original normal floating-point format exponent. Thus, loss of precision due to dropping mantissa bits (when shifting the mantissa to correspond to a shared exponent) can be reduced.

For example, consider multiplying a row-vector x by matrix W: y=xW. If an exponent is shared for each column of W, then each dot-product $xW_j$ (where $W_j$ is the j-th column of W) only involves one shared exponent for x and one shared exponent for $W_j$.

FIGS. 4 and 5 illustrate alternative block floating-point formats that can be used for computation of neural networks. In the context of neural nets, a core operation is to perform a dot product. For example, dot products are the core computation of matrix multiplication and convolutions. Matrix multiplication involves dot products of the rows/columns of the matrix with an input vector. Convolutions involve dot products of filters with windows of the input. In the context of quantized floating-point, the group of values selected to share an exponent can have an impact on the complexity of the computer arithmetic logic used for calculating the dot product. The values sharing an exponent can be referred to as the values within a bounding box. The shape of bounding boxes can potentially impact quantization error and computation cost. While clustering similar magnitude values to create bounding boxes can reduce quantization error, tracking scaling factors for arbitrary bounding box shapes may be expensive. Instead, matrices and filters can be partitioned into bounding boxes that are potentially more efficient for the operations performed by a neural network. Specifically, an appropriate selection of the bounding box can reduce the complexity of computer arithmetic circuits that are used to implement the operations of the neural network. FIG. 4 illustrates block floating-point formats that may be well suited for matrices and FIG. 5 illustrates block floating-point formats that may be well suited for convolution filters.

FIG. 4 is a diagram 400 illustrating four alternative block floating-point formats, as can be used in certain examples of the disclosed technology. As shown, a first format 410 represents an entire array 420 of values that share a single exponent 425. In other words, the entire array 420 of values is encapsulated within a single bounding box.

In a second format 430, a common exponent is shared on a per-column basis. In other words, the columns of the matrix are the bounding box for the values. Thus, in this particular example, block floating-point values stored in even columns 431 of a matrix each share a first, single exponent 432. Block floating-point values stored in odd columns 435 each share a second, single exponent 437. In other examples, each column of an array can be associated with a different shared exponent. For an eleven-column tile in the alternative format, there can be eleven corresponding shared exponents, one shared exponent per column. In other examples, each row of an array can be associated with a different shared exponent, or odd and even rows can be associated with a shared common exponent.

A third format 450 is shown where groups of elements in an array share a common exponent. For example, if a 15×15 matrix of values shares in exponent according to the third format 450, a first set of 5×5 element groups 455 and 456 share a single shared exponent 458. Similarly, a second 5×5 element group of elements in the array 460 and 461 can each shared a second single exponent 468. In other examples, each of the tiles can be associated with its own respective shared exponent. In the example format 450, there could be nine shared exponents for the 15×15 matrix.

A fourth format 470 is shown where two shared exponents are shared on a tiling plus per-column basis. Thus, a first set of numbers including numbers 480, 481, and 485 all share a single common exponent 488. Similarly, a second set of numbers including a set 490 and 491 each share a second, different single exponent 495. In an alternative example, each of the groups shown can have its own shared exponent.

In some examples, the computational cost of matrix-vector multiplication can be further reduced by reducing mantissa widths. A large range of values having a shared common exponent can be expressed with only a few bits of mantissa. for example, in a representation with 4 bits of mantissa and a 5-bit exponent, values can be expressed in a range $[2^{-14}0.001_2, 2^{15}1.111_2]$, or approximately $[2^{-17}, 2^{16}]$ in contrast, a 4-bit fixed point number can only represent values in the range $[0001_2, 1111_2]$, or approximately $[2^0, 2^4]$.

FIG. 5 is a diagram 500 illustrating three alternative block floating-point formats, as can be used in certain examples of the disclosed technology. These formats may be useful for two-dimensional convolutions, but the formats can be generalized to higher-dimensional convolutions as well. As shown, a first format 510 represents an entire convolution filter 512 of values that share a single exponent 514. A different convolution filter 516 of values can share a single exponent 518. Thus, the format 510 illustrates that an entire convolution filter can be a bounding box of the values.

In a second format 520, each spatial pixel can be a bounding box so that a common exponent is shared on a per-spatial-pixel basis, along the channel dimension. As shown, the spatial pixel values 522 share a single exponent 524 and the spatial pixel values 526 share a single exponent 528. For example, for an input with dimensions $[x, y, c_i]$, each spatial dimension x and y can define a bounding box with $c_i$ values. Similarly, for $c_o$ convolution filters of dimension $[f_x, f_y, c_i]$, each pixel $(f_x, f_y)$ for each of the $c_o$ filters can be a separate bounding box with $c_i$ values. The bounding box size for this approach is $c_i$.

In a third format 530, each spatial pixel can be sub-divided along the channel dimension so that a bounding box includes a sub-division of a spatial pixel. As shown, the sub-divided spatial pixel values 532 share a single exponent 534 and the sub-divided spatial pixel values 536 share a single exponent 538. For small $c_i$, the cost of handling the scaling factor can be significant. For example, input images at the first layer of deep convolutional neural nets may have $c_i=3$ corresponding to 3 color channels. Tracking a scaling factor for every triplet can be expensive. In this case, the convolution can be re-shaped into a matrix-matrix multiplication to increase the bounding box and decrease the expense of tracking the bounding box. For example, each convolution filter can be flattened to create a matrix W with $c_o$ columns and $f_x*f_y$, $*c_i$ rows. An input matrix X can be created where each row is a $f_x$, $*f_y$, $*c_i$ vector corresponding to a window of the input that the convolution filter sweeps over. The result Y=XW is a matrix that can be re-shaped to match the output of the convolution operation. With the convolution re-formulated as matrix multiplication, the bounding box strategies discussed above in reference to FIG. 4 for matrix multiplication can be applied.

V. Example Methods of Neural Network Training

Figure 6:
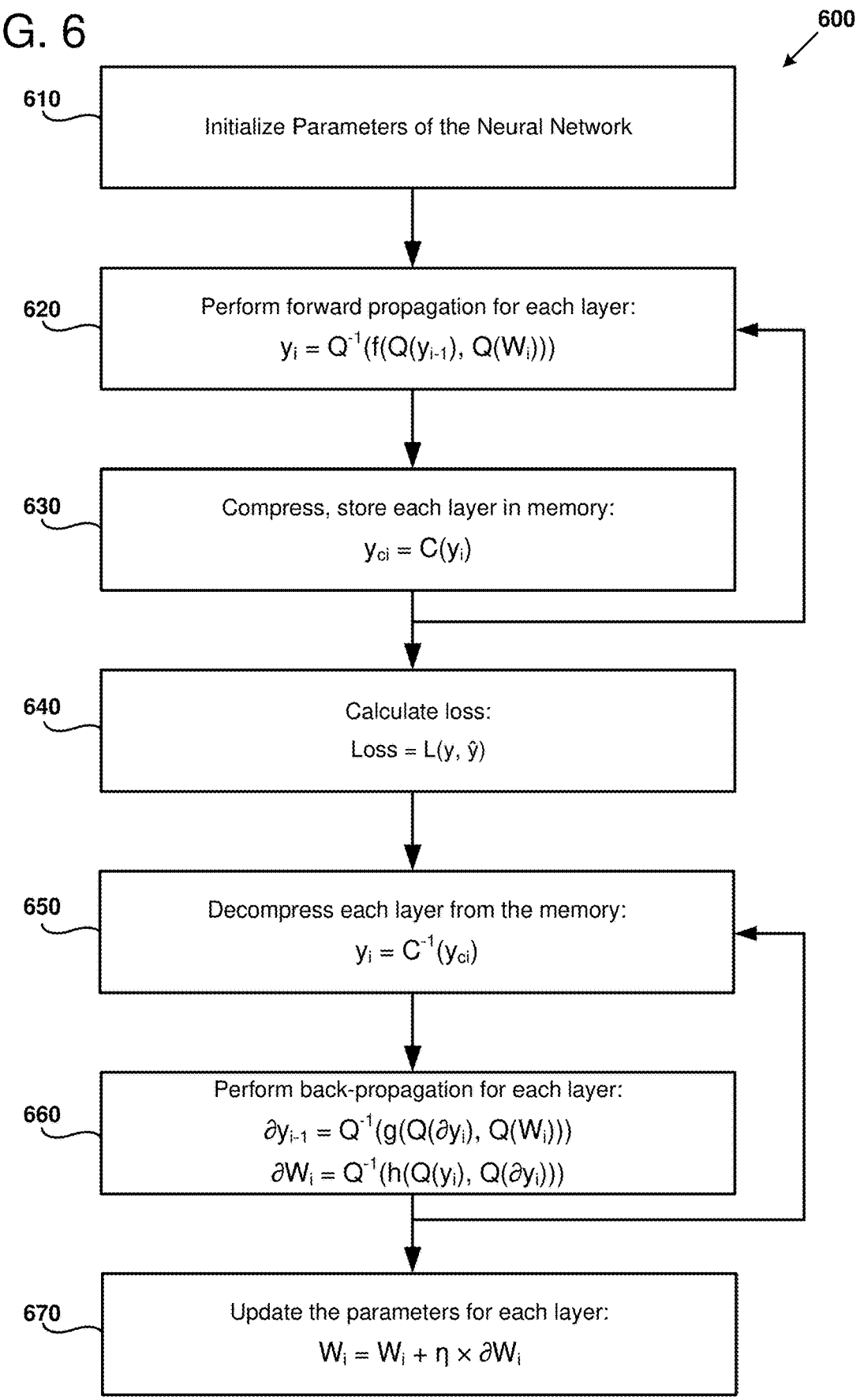
FIG. 6 is a flow chart depicting an example method of training a neural network for use with a quantized model, as can be implemented in certain examples of the disclosed technology.

FIG. 6 is a flow diagram depicting a method 600 of training a neural network using a quantized model, as can be implemented in certain examples of the disclosed technology. For example, training the neural network can include iterating through a set of training data, where the method 600 is used for updating the parameters of the neural network during a given iteration of training data. As one example, the method 600 can be performed by a quantization-enabled system, such as the quantization-enabled system 110 of FIG. 1.

At process block 610, parameters, such as weights and biases, of the neural network can be initialized. As one example, the weights and biases can be initialized to random normal-precision floating-point values. As another example, the weights and biases can be initialized to normal-precision floating-point values that were calculated from an earlier training set. The initial parameters can be stored in a memory or storage of the quantization-enabled system. In one example, the parameters can be stored as quantized floating-point values which can reduce an amount storage used for storing the initial parameters.

At process block 620, input values of the neural network can be forward propagated through the neural network. Input values of a given layer of the neural network can be an output of another layer of the neural network. The values can be passed between the layers from an output of one layer to an input of the next layer using normal-precision floating-point. The output function of the layer i can include a term that is described mathematically as:

$$y_i=Q^{-1}(f(Q(y_{i-1}),Q(W_i)))$$  (Eq. 5)

where $y_{i-1}$ is the output from a layer providing the input to layer i, $W_i$ is the weight tensor for the layer i, $f( )$ is a forward function of the layer, $Q( )$ is a quantization function, and $Q^{-1}( )$ is a de-quantization function. The output function of the layer can be the de-quantized representation of $f( )$ or alternatively, the output function can include additional terms, such as an activation function or the addition of a bias, that are performed using normal-precision floating-point (after de-quantization) or using quantized floating-point (before de-quantization). Generally, the inputs, outputs, and parameters of the layers are tensors. Typically, the inputs, outputs, and parameters of the layers will be vectors or matrices. The quantization function $Q( )$ converts normal-precision floating-point values to quantized floating-point values. The quantization function can be selected to account for the type of input data and the types of operations performed by the layer i. For example, when $y_i$ and $W_i$ are two-dimensional matrices and the output function includes a term that takes the cross product of $y_{i-1}$ and $W_i$, the quantization function for $y_{i-1}$ can use a bounding box including a row or a portion of a row of $y_{i-1}$, and the quantization function for $W_i$ can use a bounding box including a column or a portion of a column of $W_i$. The computation can be more efficient when selecting the bounding boxes to follow the flow of the operators, thus making a hardware implementation smaller, faster, and more energy efficient. The de-quantization function $Q_{-1}( )$ converts quantized floating-point values to normal-precision floating-point values.

At process block 630, a portion of a neural network, such as a layer that was just forward propagated to the next layer of the neural network can be compressed and stored in memory. For example, activation values calculated as part of forward propagation as discussed above process block 620 can be compressed and stored in the memory. This compression can be expressed mathematically as:

$$y_{ci}=C(Q2(y_i))$$  (Eq. 6a)

or $$y_{ci}=C(Q2(f(Q(y_{i-1}),Q(W_i))))$$  (Eq. 6b)

where $y_i$ are the values generated by forward propagation for a layer at process block 620, $C( )$ is an optional, additional compression function (which may include multiple compression operations), $Q2( )$ is a quantization function to a second floating-point format having lossy or non-uniform mantissas, and $y_{ci}$ are the compressed values to be stored in memory. In some examples, the $Q2( )$ quantization function translates values from a normal precision format to a smaller quantized format than used in the quantized layer (as in equation 6a). In other examples, the $Q2( )$ quantization function translates values directly from the first block floating-point format used in the quantized layer to a second block floating-point format (as in equation 6b). The compressed activation values are expressed in a second block floating-point format that can differ from a first block floating-point format used to perform forward propagation calculations and at least one of the following ways: having a different mantissa format, having a different exponent format, or having a different exponent sharing scheme. For example, if forward propagation was performed using activation values expressed in an 8-bit format, these values can be transformed to a 4-bit format by converting the mantissa to a lossy or non-uniform mantissa. As another example, activation value exponents, including shared exponents in BBFP format can be transformed from a 7-bit formaTanback propagation, an output error term $\partial y$ and a weight error term $\partial W$ can be calculated. The output error term can be described mathematically as:

$$\partial y_{i-1}=Q^{-1}(g(Q(\partial y_i),Q(W_i)))$$  (Eq. 8)

where $\partial y_{i-1}$ is the output error term from a layer following layer i, $W_i$ is the weight tensor for the layer i, $g( )$ is a backward function of the layer, $Q( )$ is a quantization function, and $Q^{-1}( )$ is a de-quantization function. The backward function $g( )$ can be can be the backward function of $f( )$ for a gradient with respect to or a portion of the gradient function. The output error term of the layer can be the de-quantized representation of $g( )$ or the output error term can include additional terms that are performed using normal-precision floating-point (after de-quantization) or using quantized floating-point (before de-quantization).

The weight error term ∂W can be described mathematically as:

$$\partial W_i = Q^{-1}(h(Q(y_i), Q(\theta y_i))) \quad \text{(Eq. 9)}$$

where $\partial W_i$ is the weight error term for the layer i, $\partial y_i$ is the output error term for the layer i, $y_i$ is the output for the layer i, h( ) is a backward function of the layer, Q( ) is a quantization function, and $Q^{-1}($ ) is an inverse quantization function. The backward function h( ) can be can be the backward function of f( ) for a gradient with respect to or a portion of the weight error equation 9. The weight error term of the layer can be the de-quantized representation of h( ) or the weight error term can include additional terms that are performed using normal-precision floating-point (after de-quantization) or using quantized floating-point (before de-quantization). The weight error term can include additional terms that are performed using normal-precision floating-point.

At process block 670, the parameters for each layer can be updated. For example, the weights for each layer can be updated by calculating new weights based on the iteration of training. As one example, a weight update function can be described mathematically as:

$$W_i = W_i + \eta \times \partial W_i \quad \text{(Eq. 10)}$$

where $\partial W_i$ is the weight error term for the layer i, $\eta$ is the learning rate for the layer i for the neural network, $W_i$ is the weight tensor for the layer i. In one example, the weight update function can be performed using normal-precision floating-point.

VI. Example Environment for Performing

Activation Compression Using Non-Uniform Mantissa Block Floating-Point

Figure 7:
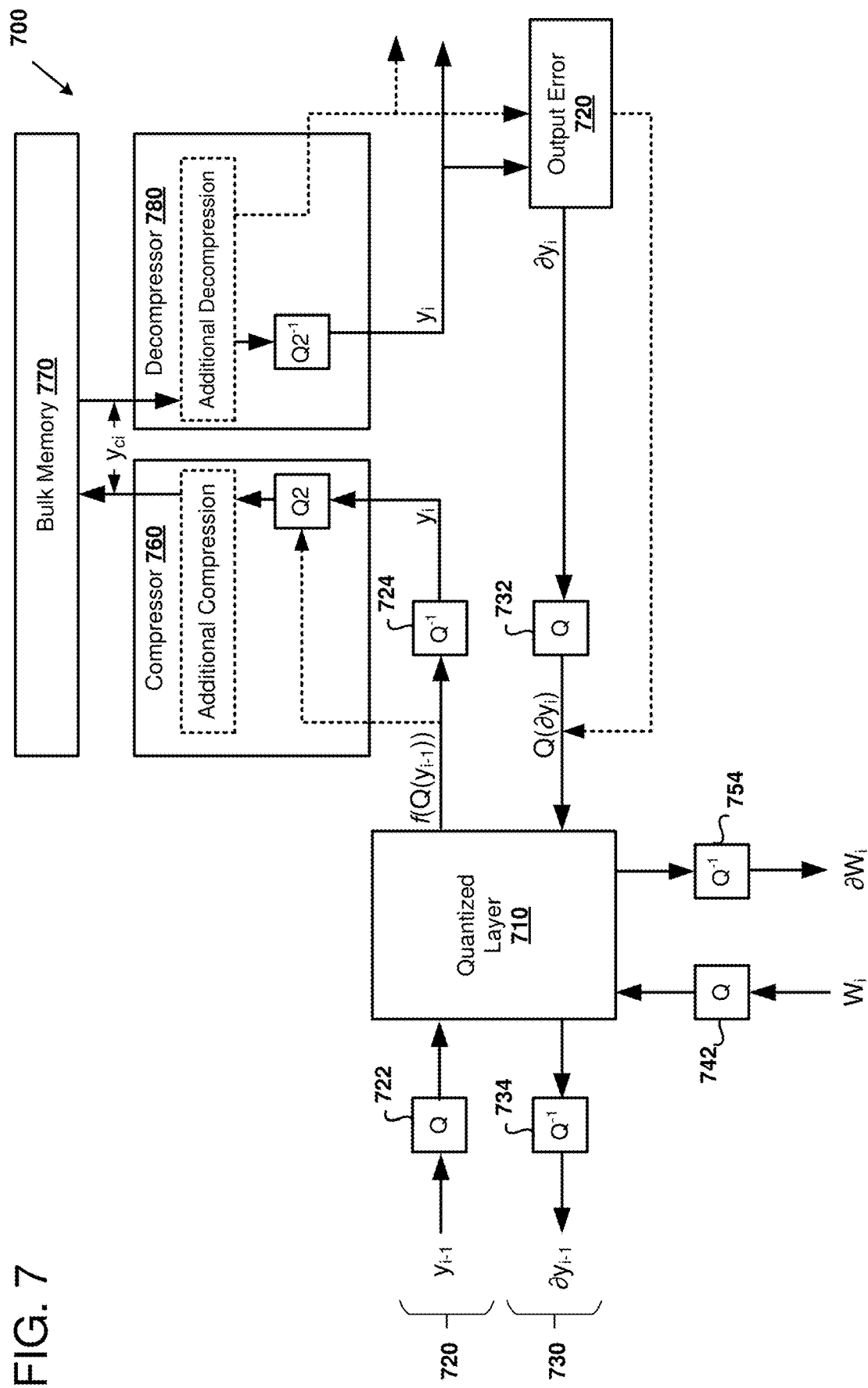
FIG. 7 is a block diagram depicting an example environment for implementing activation compression with non-uniform mantissa floating-point formats, as can be implemented in certain examples of the disclosed technology.

FIG. 7 is a block diagram 700 depicting an example of a suitable environment for performing activation compression and associated floating-point operations between a normal-precision floating-point domain, a quantized floating-point domain, and a floating-point domain having lossy or non-uniform mantissas. The floating-point domain having lossy or non-uniform mantissas can be have exponents for all values, or be a block floating-point format having two or more shared exponents. As described above, more computationally expensive operations such as vector-vector, vector-matrix, matrix-matrix, and convolution operations can be performed by the quantized layer 710 in the quantized floating-point domain. Less computationally expensive operations such as scalar add and scalar multiply can be performed outside of the quantized layer 710 in the normal-precision floating-point domain. With regard to neural networks, a neural network can be partitioned into layers (such as quantized layer 710). For the back propagation portion of training, an error output component 720 can receive the activation values and use additional functions, such as an error function or an objective function, to calculate the output error term $\partial y_i$. In some examples, the output error terms $\partial y_i$ are calculated in a normal-precision floating-point domain, as shown by the solid lines to the output error component 720. In other examples, the output error component 720 calculates the error output terms in a block floating-point format.

The bulk of the computational work within a layer can be performed in the quantized floating-point domain and less computationally expensive operations of the layer, such as adding a bias value or calculating an activation function, can be performed in the normal-precision floating-point domain. The values that interface between the layers can be passed from one layer to the other layer in the normal-precision floating-point domain. By quantizing the inputs specifically for a given layer, the quantization can be targeted to the operations of that layer so that the operations of the layer are more efficient. Specifically, bounding boxes of the quantized floating-point format can be selected to reduce the complexity of the computer arithmetic circuits to make the computer logic potentially faster and/or more energy efficient.

As one example, the output values $y_i$, the output error term $\partial y_i$, the weights $W_i$, and the weight error terms $\partial W_i$ for a given layer can be stored in the normal-precision floating-point domain During the forward propagation flow, the output values from an earlier layer can be communicated from the normal-precision floating-point domain to the quantized floating-point domain through the quantizer 722 that converts from normal-precision floating-point to quantized floating-point. The output values from the given layer can be communicated from the quantized floating-point domain to the normal-precision floating-point domain through the de-quantizer 724 that converts from quantized floating-point to normal-precision floating-point. The weights for the given layer can be communicated from the normal-precision floating-point domain to the quantized floating-point domain through the quantizer 742. The de-quantized values $y_i$ or the quantized values $Q^{-1}(y_i)$ can be sent to a compressor 760, which compresses the values before they are stored in a bulk memory 770.

The compressor 760 can be a block floating-point compressor, or provide other forms of compression to reduce the amount of data stored in the bulk memory 770. In such examples, values expressed in the second block floating-point format have lossy or non-uniform mantissas. Typically, the first block floating-point format used to represent values during quantized layer 710 operations has uniform mantissas (e.g., in a normal precision floating-point or block floating-point format). For example, the first block floating-point format used in the quantized layer 710 may have mantissas having more bits than the second block floating-point format, for example: four, five, six, seven, or eight bits; and the second block floating-point format may have non-uniform mantissas having fewer bits than the first block floating-point format, for example: three, four, four or five, five or six, or four to six bits, respectively. It should be readily understood to one of ordinary skill in the relevant art having the benefit of the present disclosure that foregoing recited combinations of particular numbers of bits in the first block floating-point format and a second block floating-point format are merely preferred examples, but that other combinations of precision of mantissa format may be used in other examples. In some examples, the second block floating-point format has a lower precision exponent than the first block floating-point format. In some examples, the first block floating-point format uses a sharing format that is different than the sharing format for a common exponent of the second block floating-point format. For example, the sharing format can be different based on per-row, per-column, or per-tile sharing of a common exponent for the compressed activation values. The precision of the second block floating-point format can be adjusted in a number of different ways, including rounding, truncation, and/or shifting of mantissa values.

In the illustrated example, the activation values are dequantized 724 to a normal precision format prior to converting to the second block-floating-point format and storing in the bulk memory 770. In some examples, the compressor 760 is configured to further compress activation values in the second block floating-point format by performing at least one or more of the following compression operations: entropy compression, zero compression, run length encoding, compressed sparse row compression, or compressed sparse column compression.

The bulk memory 770 can be implemented using any suitable memory or storage technology. In some examples, memory storing temporary values in the quantization layer 710 is typically implemented as static ram (SRAM), embedded dynamic RAM (eDRAM), in a register file, in a block RAM, or other suitable structure, while the bulk memory 770 is typically implemented in memory structures supporting larger, but often slower access, for example off-chip DRAM, network accessible RAM, SSD drives, hard drives, or network-accessible storage. As will be readily understood to one of ordinary skill in the art having the benefit of the present disclosure, the types and arrangement of memory used to implement memory for the quantization layer 710 and the bulk memory 770 can be selected depending on desired performance attributes such as costs, energy, and speed.

A decompressor 780 reads the compressed activation values from the bulk memory 770 and reverses the operations performed by the compressor 760. In examples where additional compression is applied to the quantized values, the values are compressed. The values can then be translated from the second block floating-point format to a normal precision floating-point format. The second block floating-point format values can be dequantized in a number of different ways, such as those discussed above at process block 650 for the method of FIG. 6. For example, the dequantized non-uniform mantissa values can be converted to the same values in a uniform mantissa format. Alternatively, the dequantized non-uniform mantissa values can be converted to the approximate values in a uniform mantissa format, alternate values chosen in a deterministic fashion, or random values according to a distribution selected for a particular non-uniform mantissa value. In alternative examples, the values are output by the decompressor 780 in a quantized block floating-point format, as indicated by the dashed line.

The output error component 720 can receive activation values in normal precision floating-point format (as in equation 6a). In alternative examples, the output error component 720 can receive activation values in a quantized floating-point format (as in equation 6b), such as the second block floating-point format, as indicated by the dashed line. The output error component 720 calculates the derivative of the activation value which is used in back propagation. The back propagation is performed using the quantized layer 710 as indicated in the diagram 700.

The dashed arrows in the diagram 700 depict an alternative path for compressing and decompressing activation values. As shown, as successive layers of a neural network are forward propagated, producing first activation values in a first block floating-point format, the compressor can convert the quantized activation values from the first block floating-point format directly to a second block floating-point format, thereby producing compressed activation values, without converting to normal precision format.

During the back-propagation flow 730, the output error terms from a later layer can be communicated from the normal-precision floating-point domain to the quantized floating-point domain through the quantizer 732. The output error term from the given layer can be communicated from the quantized floating-point domain to the normal-precision floating-point domain through the de-quantizer 734. The weights for the given layer can be communicated from the normal-precision floating-point domain to the quantized floating-point domain through the quantizer 742. The weight error term error term from the given layer can be communicated from the quantized floating-point domain to the normal-precision floating-point domain through the de-quantizer 754. As back propagation proceeds, quantized activation values in the second block floating-point format are either converted to a normal precision format and translated to the first block floating-point format through the quantizer 732, or alternatively, are converted from the second block floating-point format used to store the activation values in the bulk memory 770 to the first block floating-point format used by the quantized layer 710. Further, in examples where additional compression (e.g., entropy coding, zero encoding, or other additional compression scheme) is applied prior to storing in the bulk memory 770, the data can be further decompressed before the quantizing.

Figure 8:
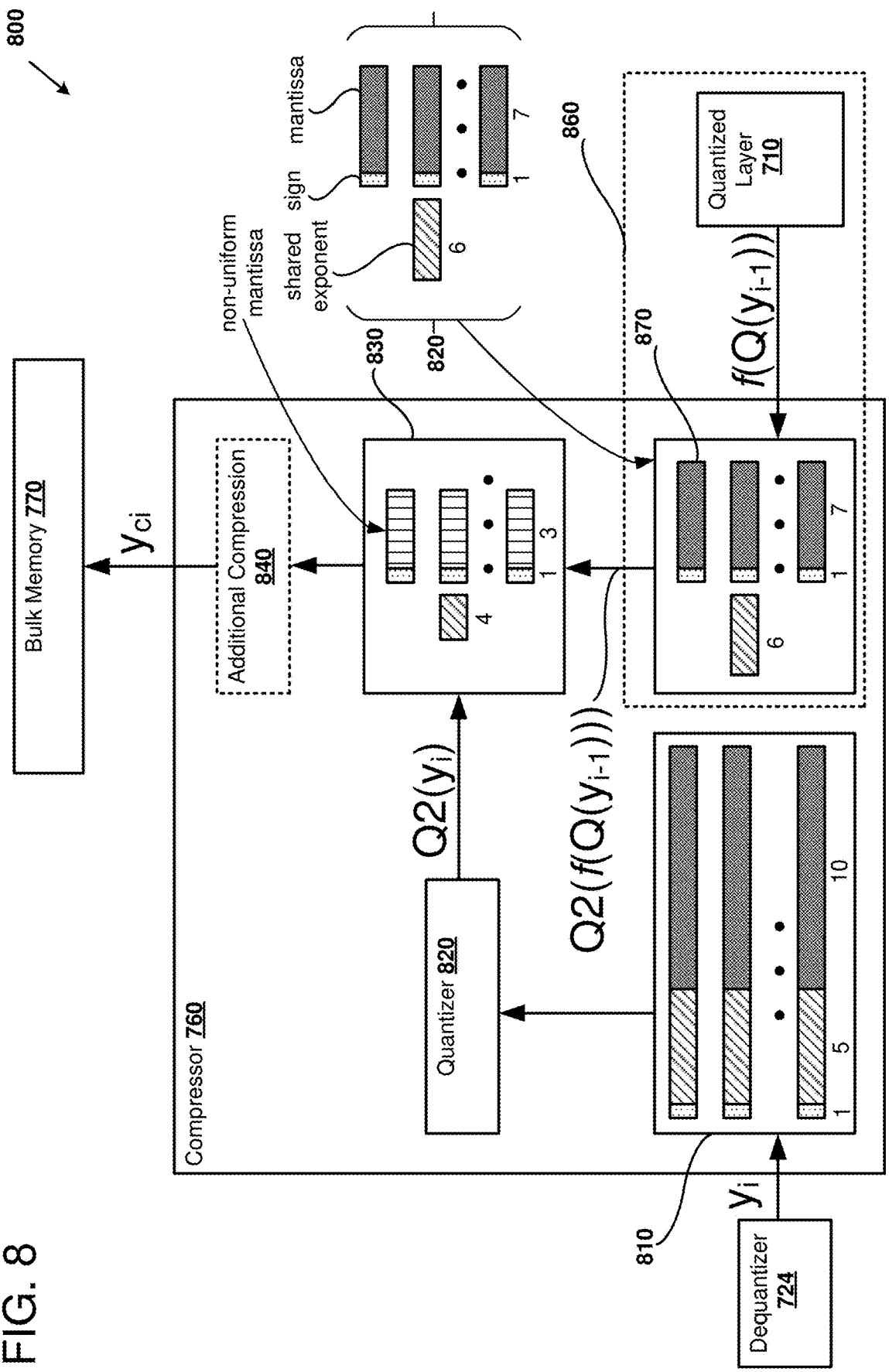
FIG. 8 is block diagram depicting an example of activation compression with non-uniform mantissa floating-point formats, as can be implemented in certain examples of the disclosed technology.

FIG. 8 is a diagram 800 further detailing operation of the compressor 760 discussed above regarding FIG. 7. As shown in the diagram 800, activation values $y_i$ are received from a dequantizer 724. The dequantizer 724 can receive the activation values from local memory used to implement the quantized layer 710.

As shown in FIG. 8, set of normal precision floating-point values 810 are received by the compressor 760, for example from the de-quantizer 724. These set of normal precision floating-point values 810 are provided to a quantizer 820 which implements a quantization function Q2( ) that converts the normal precision values to a second block floating-point format having lossy or non-uniform mantissas, different than the block floating-point format used by the quantized layer 710. In the illustrated example, the normal precision floating-point values 810 each have a 10-bit mantissa, a 5-bit exponent (for each value), and a 1-bit sign bit. These normal precision floating-point values 810 are converted to a set of values $Q2(y_i)$ in the second block floating-point format 830. In the illustrated example, values expressed in the second block floating-point format 830 each have a non-uniform 3-bit mantissa, a 1-bit sign bit, and all share a 4-bit exponent. In some examples, the exponent is not shared by all of a set of values, but can be shared on a per-row, per-column, or per-tile basis. As will be readily understood to a person of ordinary skill in the relevant art having the benefit of the present disclosure, any suitable floating-point format using lossy or non-uniform mantissas can be used for the second block floating-point format 830. For example, for a four-bit number having a sign bit and three mantissa bits, the 3-bit mantissa (which can represent 8 values, for example, the set {0, 1, 2, 3, 4, 5, 6, 7} may be converted to a lossy mantissa having discrete sets of mantissa values, for example, any one of the sets: {0, 1, 3, 7}, {0, 1, 7}, or {0, 7}, depending on a selected lossy mantissa scheme. The underlying representation of the lossy mantissa may vary. For the preceding three sets, an example set of respective binary representations is {00, 01, 10, 11}; {00, 10, 11}; and {0, 1}; respectively. In some examples, multi-value (non-binary) representations can be used to for the underlying representation of the lossy mantissa. For example, multi-level EEPROM or flash devices can store a lossy mantissa using multi-level storage cells.

The set of values in the second block floating-point format 830 can in some examples be provided to an additional compression unit 840 to be further compressed prior to storing in the bulk memory 770. Examples of suitable techniques for further compressing activation values in the compressed quantized format include entropy compression, zero compression, run length compression, compressed sparse row compression, or compressed sparse column compression.

Whether or not the quantized values in the second block floating-point format 830 are subject to additional compression, the compressed values y ci are stored in the bulk memory 770. The bulk memory 770 is typically implemented in memory structures supporting larger, but often slower access, for example off-chip DRAM, network accessible RAM, SSD drives, hard drives, or network-accessible storage. As will be readily understood to one of ordinary skill in the art having the benefit of the present disclosure, the types and arrangement of memory used to implement memory the bulk memory 770 can be selected depending on desired performance attributes such as costs, energy, and speed.

FIG. 8 further illustrates an alternative example apparatus 860 for storing values in a second block floating-point format, where quantized values are received directly from the quantized layer 710, instead of receiving values in normal-precision floating-point format. In this alternative example apparatus 860, quantized values $f(Q(y_{i-1}))$ are received directly from the quantized layer in the first block floating-point format 870, where each of the set of values has a 7-bit mantissa, a 1-bit sign bit, and a shared 6-bit exponent. In some examples, the shared exponent is not shared by all values in the said, but can be shared with only certain values on a per-row, per-column, or per-tile basis. These values in the first block floating-point format can be converted directly to the second block floating-point format $Q2(f(Q(y_{i-1})))$, as shown. The set of values in the second block floating-point format 830 can also be provided to the additional compression unit 840 prior to being stored in the bulk memory 770.

As will be readily understood to one of ordinary skill in the relevant art having the benefit of the present disclosure, the illustrated normal-precision and block floating-point formats are not limited to the particular selections of mantissa, exponent, and sign bit with illustrated, and schemes for sharing exponents between values may also be varied, depending on desired aspects of a particular implementation of the compressor 760. Further, value stored in the bulk memory 770 can be decompressed by reversing the operations shown in the diagram 800.

A different number of techniques can be used to dequantize lossy or non-uniform mantissas. For example, when the set of non-uniform mantissas is {0, 1, 3, 7} (stored, e.g., in two-bit mantissa format), those same values can be restored as the dequantized values in the first normal-precision (e.g., 8-, 16-, or 32-bit) or block floating-point (e.g., 3, 4, 5, or 6-bit) mantissa. In some examples, the dequantized mantissa can be an approximation. For example, for the set {0, 1, 3, 7}, the dequantized mantissas can be {0, 1, 3, 5}. In some examples, the dequantized value is selected in a deterministic fashion. For example, for the set {0, 1, 3, 7}, the value 3 can be dequantized to 2 the first time the value is encountered, 3 the second time, 4, the third time, then back to 2 on the fourth time the value is encountered. In some examples, a randomly-selected dequantized mantissa can be used. For example, for the set {0, 1, 3, 7}, the non-uniform mantissa value 3 can be translated to a random value selected from the set {2, 3, 5, 6} and the non-uniform mantissa value 7 can be translated to a random value selected from the set {5, 4, 6, 7}. In some examples, the random value is selected according to a uniform distribution, while in other examples, a normal (Gaussian), Poisson, or other probability distribution is used to select the de-quantized mantissa.

VII. Example Non-Uniform, Lossy Mantissa Formats

FIGS. 9-12 illustrated examples of non-uniform, lossy mantissa formats that can be used to store compressed activation values in certain examples of the disclosed technology. As will be readily understood to a person of ordinary skill in the relevant art having the benefit of the present disclosure, these examples are provided for illustration purposes, but other lossy non-uniform formats can be used in other examples.

Figure 9:
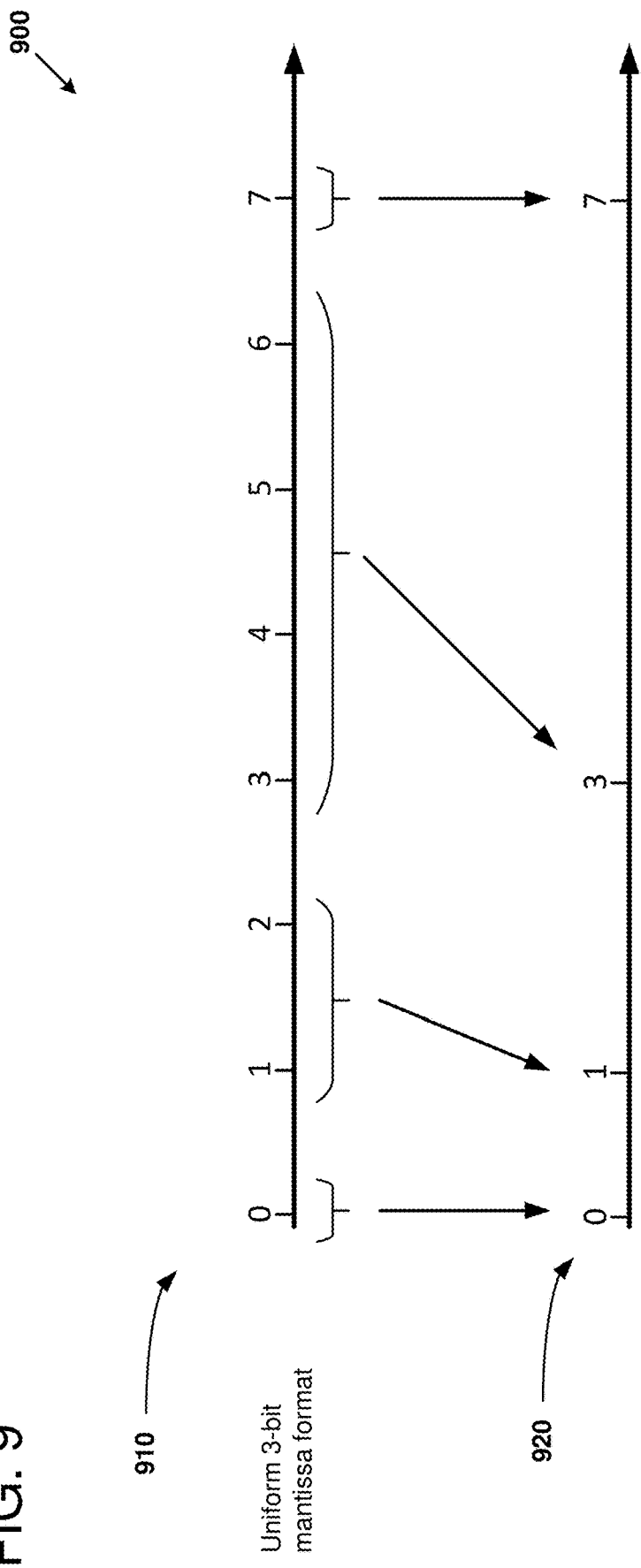
FIG. 9 is a diagram illustrating converting a uniform three-bit mantissa format to a non-uniform, four value lossy mantissa format, as can be implemented in certain examples of the disclosed technology.

FIG. 9 is a diagram 900 illustrating an example of converting a uniform, 3-bit mantissa format to a non-uniform, four-value lossy mantissa format, which can be dubbed a "lite lossy format." As shown in the illustrated example, a set of uniform values 910 in the uniform, 3-bit mantissa format is mapped to a set of values 920 in the non-uniform, four-value lossy mantissa format in a non-uniform fashion. When the uniform mantissa value is 0, it converted to a lossy mantissa value 0. When the uniform mantissa value is 1 or 2, the value is converted to a lossy mantissa value of 1. When the uniform mantissa value is any of 3, 4, 5, or 6, the value is converted to a lossy mantissa value of 3. When the uniform mantissa value is 7, the value is converted to a lossy mantissa value of 7. The underlying representation may be a four-bit representation, in other words, 0, 1, 3, and 7 may be represented as binary values 00, 01, 10, or 11, respectively. Other underlying representations may also be used. The starting source mantissas are not limited to three bits, as in the illustrated example, but may have additional numbers of bits, for example: 4, 5, 6, . . . 32 bits. In more general terms, a four-value lite lossy mantissa maps higher-precision mantissa values in the set of four ranges: {[0], [1, mid-point−1], [mid-point, max−1], [max]} to lossy mantissa values {0, 1, mid-point, max}, where mid-point is a value somewhere between 1 and max (the maximum value) in the set.

Figure 10:
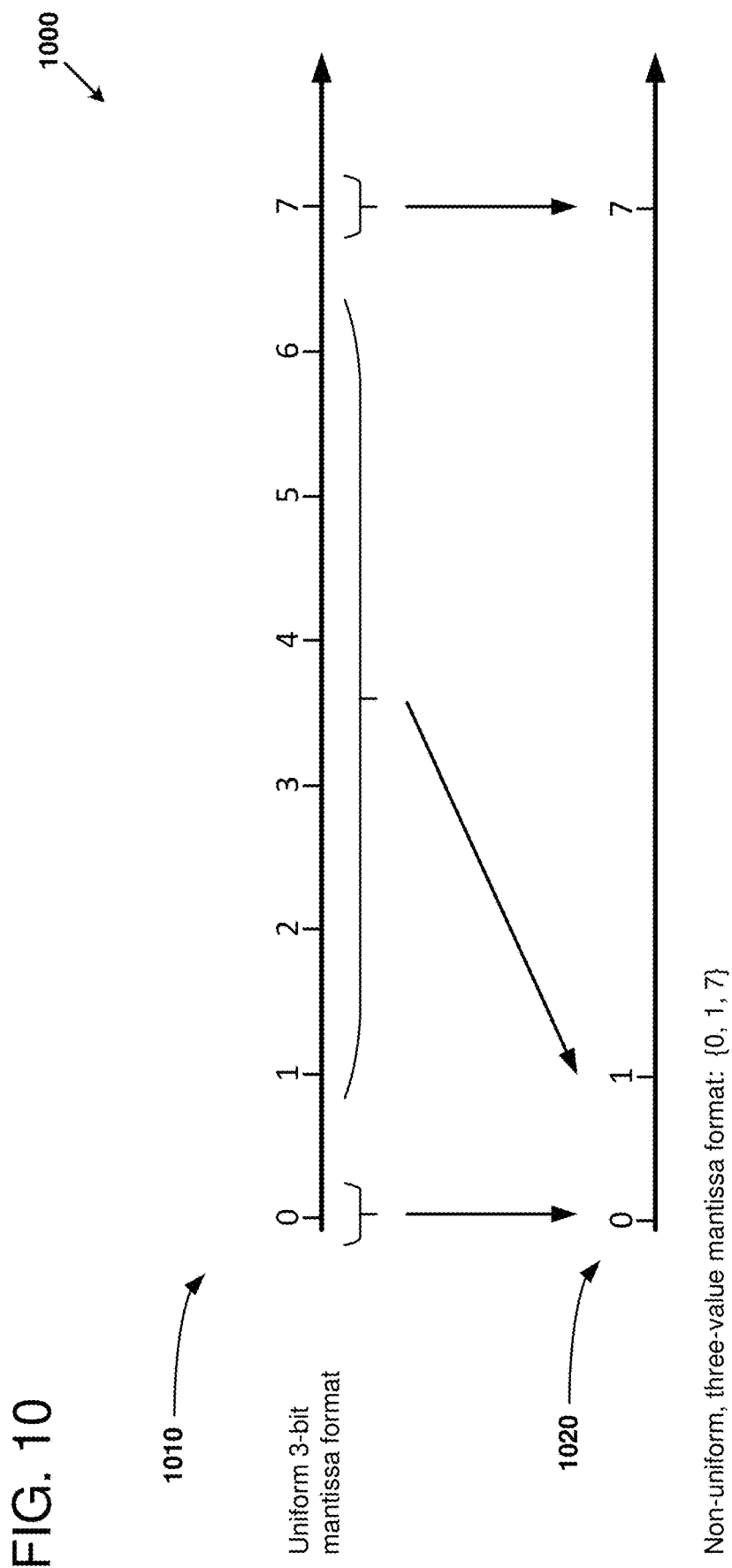
FIG. 10 is a diagram illustrating converting a uniform three-bit mantissa format to a non-uniform, three-value lossy mantissa format, as can be implement it in certain examples of the disclosed technology.

FIG. 10 is a diagram 1000 illustrating an example of converting a uniform, 3-bit mantissa format to a non-uniform, three-value lossy mantissa format, which can be dubbed a "normal lossy format." As shown in the illustrated example, a set of uniform values 1010 in the uniform, 3-bit mantissa format is mapped to a set of values 1020 in the non-uniform, three-value lossy mantissa format in a non-uniform fashion. When the uniform mantissa value is 0, it converted to a lossy mantissa value 0. When the uniform mantissa value is any of 1, 2, 3, 4, 5, or 6, the value is converted to a lossy mantissa value of 1. When the uniform mantissa value is 7, the value is converted to a lossy mantissa value of 7. The underlying representation may be a two-bit representation, in other words, 0, 1, and 7 may be represented as binary values 00, 01, 10, or 11, respectively. In other examples, other representations with varying numbers of bits can be used, for example, 0, 10, and 11 for 0, 1, and 7, respectively. Other underlying representations may also be used. The starting source mantissas are not limited to three bits, as in the illustrated example, but may have additional numbers of bits, for example: 4, 5, 6, . . . 32 bits. In more general terms, a normal lossy mantissa maps higher-precision mantissa values in the set of three ranges, minimum, in-between, and maximum: {[0], [1, max−1],

[max]} to lossy mantissa values {0, 1, max}, where max is the maximum value in the set.

Figure 11:
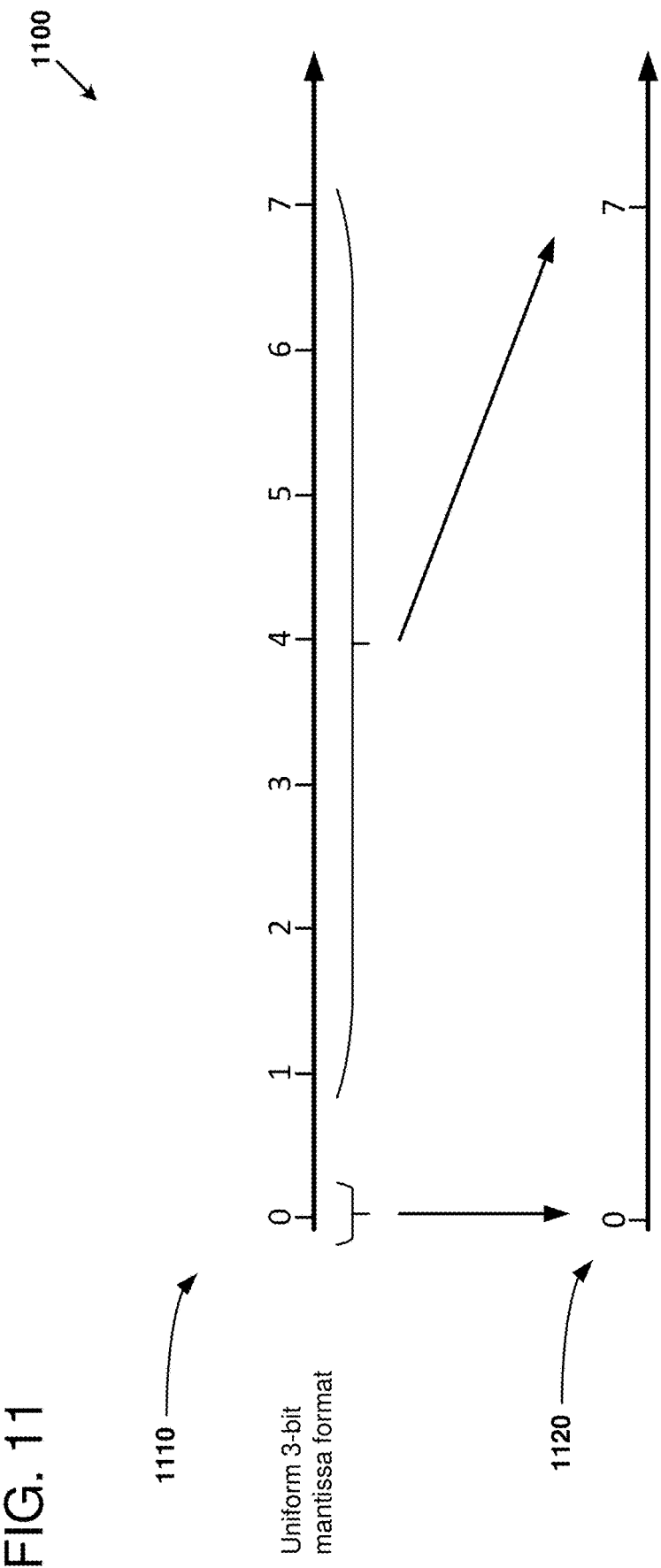
FIG. 11 is a diagram illustrating converting a uniform three-bit mantissa format to a non-uniform, two value the lossy mantissa format, as can be implemented in certain examples of the disclosed technology.

FIG. 11 is a diagram 1100 illustrating an example of converting a uniform, 3-bit mantissa format to a non-uniform, three-value lossy mantissa format, which can be dubbed an "aggressive lossy format." As shown in the illustrated example, a set of uniform values 1110 in the uniform, 3-bit mantissa format is mapped to a set of values 1120 in the non-uniform, two-value lossy mantissa format in a non-uniform fashion. When the uniform mantissa value is 0, it converted to a lossy mantissa value 0. When the uniform mantissa value is any one of 1, 2, 3, 4, 5, 6, or 7, the value is converted to a lossy mantissa value of 7. The underlying representation may be a one-bit representation. Other underlying representations may also be used. The starting source mantissas are not limited to three bits, as in the illustrated example, but may have additional numbers of bits, for example: 4, 5, 6, . . . 32 bits. In more general terms, an aggressive lossy mantissa maps higher-precision mantissa values in the set of two ranges: {[0], [1, max]} to lossy mantissa values {0, max}, where max is the maximum value in the set.

Figure 12:
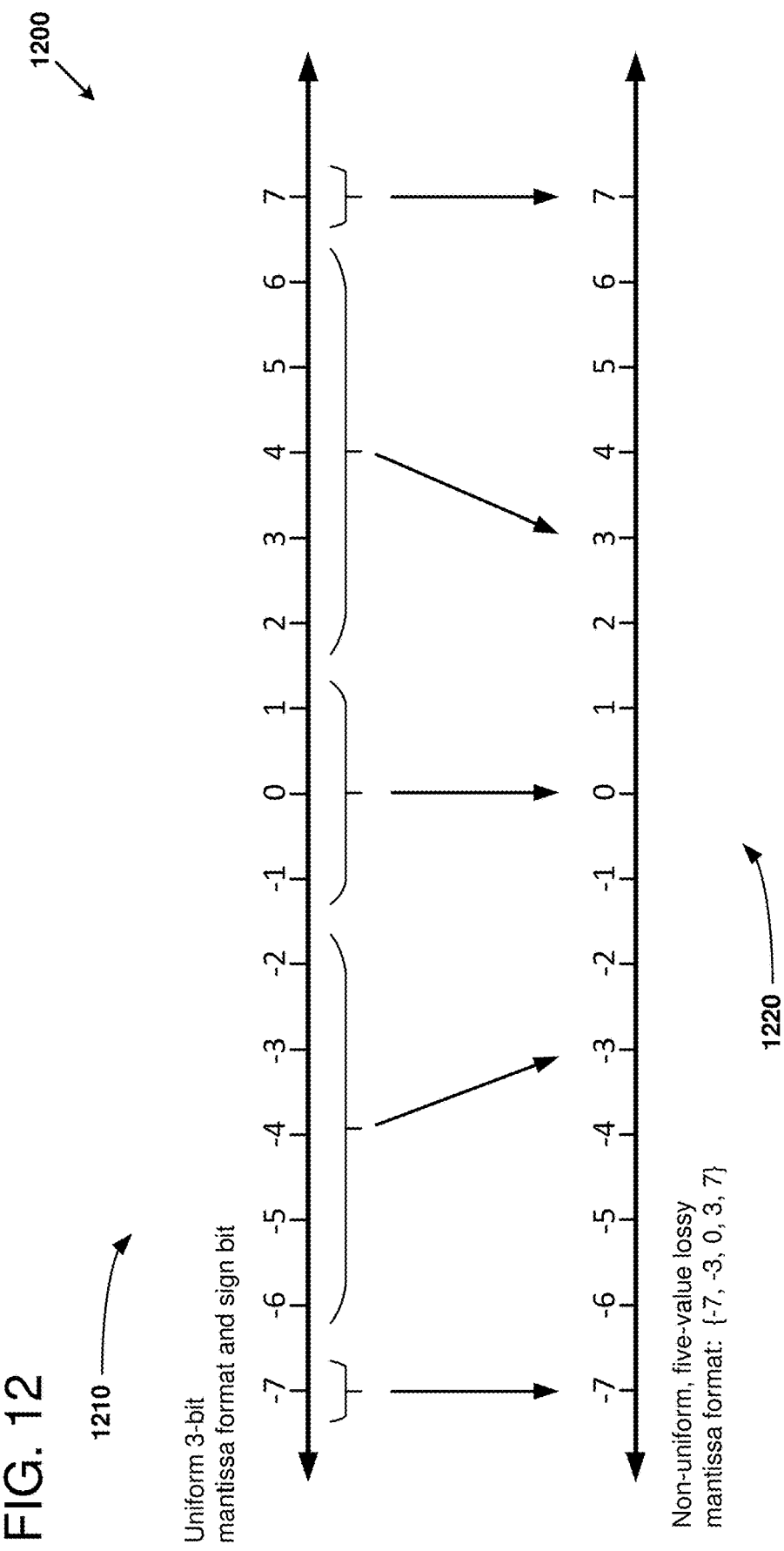
FIG. 12 is a diagram illustrating converting a sign value and three-bit mantissa format to a non-uniform five-value lossy mantissa format, as can be implement it in certain examples of the disclosed technology.

FIG. 12 is a diagram 1200 illustrating an example of converting a uniform value expressed as a sign/mantissa value (as a sign bit and a 3-bit mantissa) to a non-uniform value, which can be dubbed a "full range lossy format." As shown in the illustrated examples, a set of uniform values 1210 in the uniform format is mapped to a set of values 1220 in a non-uniform, five-value lossy mantissa format in a non-uniform fashion. When the sign/mantissa value is −7, it is converted to a lossy mantissa value of −7. When the sign/mantissa value is any one of −6, −5, −4, −3, or −2, it is converted to a lossy mantissa value of −3. When the sign/mantissa value is any one of −1, 0, or 1, it is converted to a lossy mantissa value of 0. When the sign/mantissa value is any one of two, three, four, five, or six, it is converted to a lossy mantissa value of 3. When the sign/mantissa value is 7, it is converted to a lossy mantissa value of 7. The underlying representation for the lossy sign/mantissa values may be, for example, a three-bit representation. Other underlying representation formats may also be used. The starting source mantissas are not limited to three bits, as in the illustrated example, but may have additional numbers of bits, for example: 4, 5, 6, . . . 32 bits.

VIII. Example Method of Using Activation Values with Non-Uniform Mantissas

Figure 13:
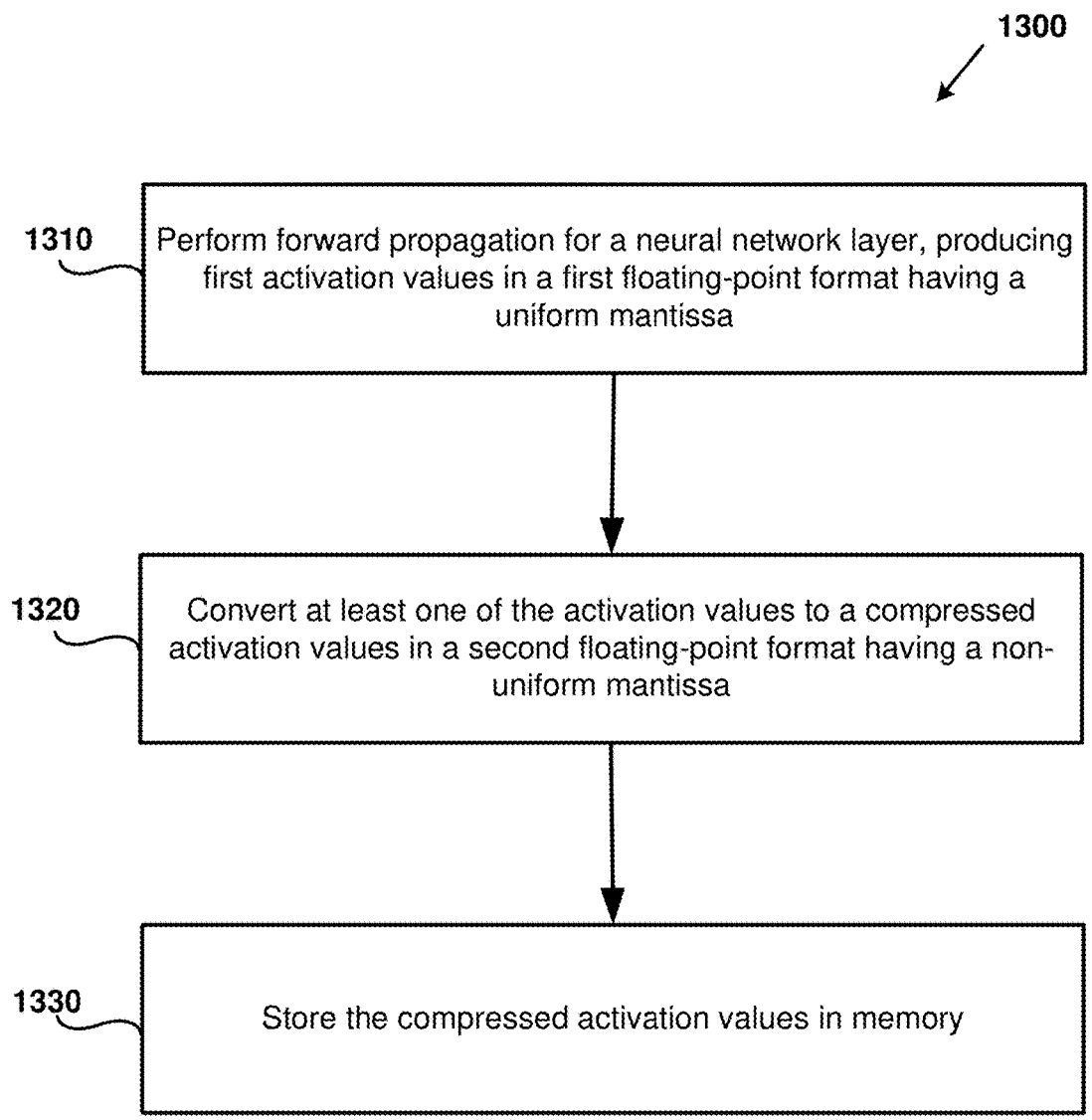
FIG. 13 is a flow chart outlining an example method of using compressed activation values having non-uniform mantissas, as can be performed in certain examples of the disclosed technology.

FIG. 13 is a flowchart 1300 outlining an example method of using activation values expressed with non-uniform mantissas, as can be performed in certain examples of the disclosed technology. As one example, the illustrated method can be performed using a quantization enabled system, such as the quantization enabled system 110 discussed above regarding FIG. 1 and further detailed in the quantization environment discussed above regarding FIGS. 7 and 8. In some examples, the illustrated method is used as part of a method of training neural networks.

At process block 1310, forward propagation is performed for a layer of a neural network, first activation values are produced in a first floating-point format. The floating-point format can be a normal-precision floating-point format or a block floating-point format. The mantissas for floating-point numbers in the first format are typically expressed as one of a set of uniform values. For example, standard multi-bit binary values can be used to express the mantissas.

At process block 1320, at least some of these first activation values can be converted to a second block floating-point format having non-uniform mantissas to produce compressed activation values in the second block floating-point format. Any suitable format for expressing non-uniform mantissas can be employed. For example, for the examples discussed above regarding FIGS. 9-12, any of the light lossy, normal lossy, aggressive lossy, or full range lossy mantissa formats can be used. In some examples, the second block floating-point format has a lower precision exponent, or a different exponent sharing scheme than values stored in the first block floating-point format. In some examples, the values can be further compressed by, for example using entropy compression, or another suitable compression scheme. In some examples, the first activation values are converted to a normal precision floating-point format prior to being converted to the second block floating-point format. In other examples, the first activation values are converted directly from the first block floating-point format to the second block floating-point format.

At process block 1330, the activation values are stored in a bulk memory. The bulk memory can be implemented in any suitable storage technology, including, for example, on- or off-chip DRAM, network accessible RAM, SSD drives, hard drives, or network-accessible storage. In some examples, the bulk memory is situated on a different integrated circuit than a hardware accelerator used process block floating-point values. In some examples, the bulk memory is situated on the same integrated circuit as a hardware accelerator used to process block floating-point values. After activation values are stored in the bulk memory, computations for a neural networks can proceed to a next layer. For example, once activation values for a layer have been stored of the bulk memory, forward propagation can continue for a number of different layers in the neural network.

When performing back propagation, activation values stored in the bulk memory at process block 1330 are retrieved. For example, when back propagation is performed for a neural network, the activation values can be retrieved from the bulk memory and used to calculate gradients as part of a back propagation process. The activation values retrieved from the bulk memory are converted from the second quantized format used to store the values and memory to the first quantized format used in performing neural network calculations. For example, a hardware accelerator may be configured to process neural networks using value expressed in the first block floating-point format.

IX. Example Method of Training a Neural Network Using

Activation Compression with Non-Uniform Mantissa Block Floating-Point

Figure 14:
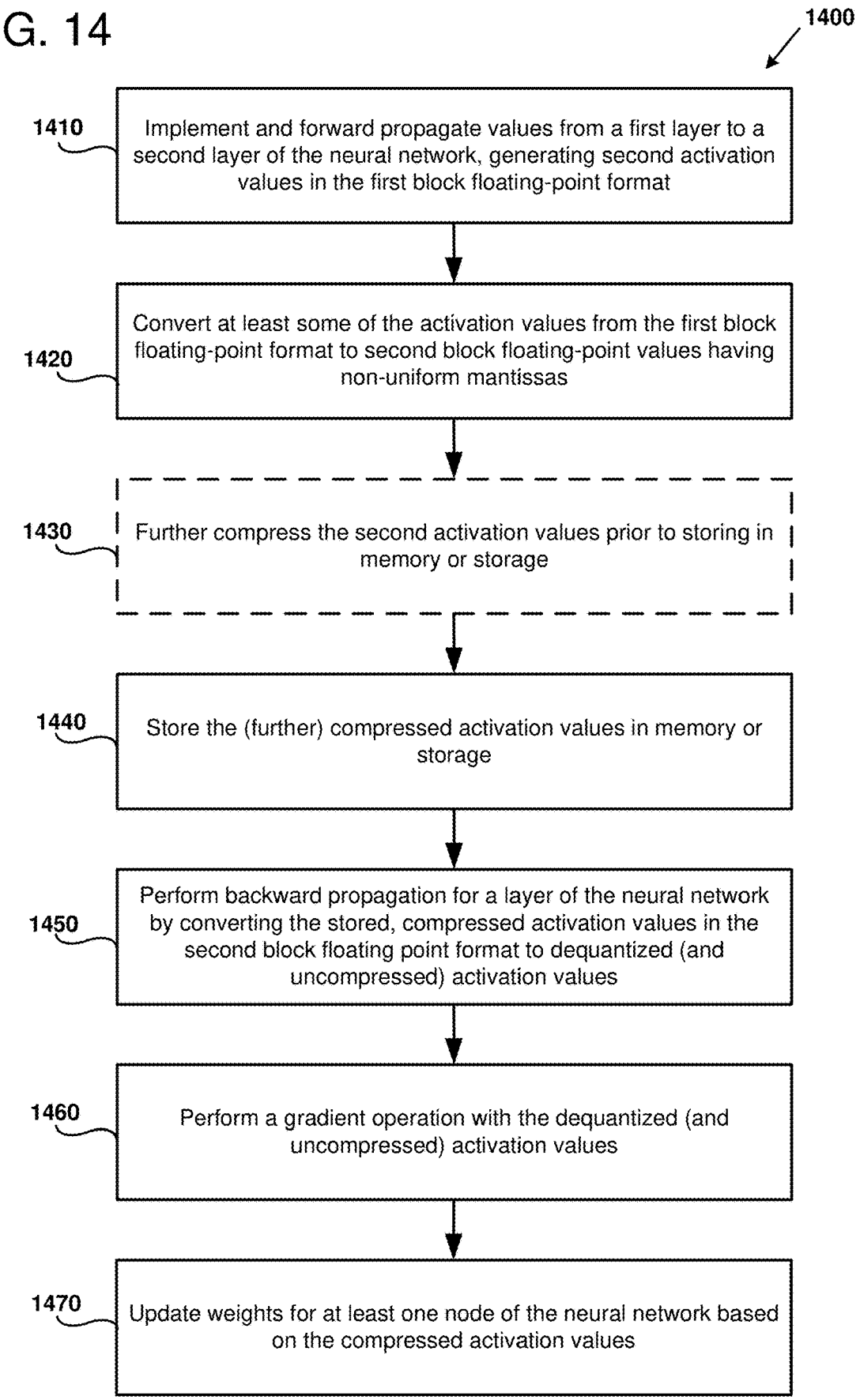
FIG. 14 is a flowchart outlining an example method of training a neural network using activation compression with non-uniform mantissa floating-point values, as can be performed in certain examples of the disclosed technology.

FIG. 14 is a flow diagram 1400 outlining an example method of training a neural network using activation compression with non-uniform mantissa block floating-point formats, as can be performed in certain examples of the disclosed technology. As one example, the illustrated method can be performed using a quantization enabled system, such as the quantization enabled system 110 discussed above regarding FIG. 1 and further detailed in the quantization environment discussed above regarding FIGS. 7 and 8. In some examples, the illustrated method is used as part of a method of training neural networks.

At process block 1410, at least one layer of a neural network is implemented by providing first weights and/or first activation values in a first block floating-point format.

For example, a source neural network expressed in normal-precision floating-point can have its weights and/or activation values converted to a selected first block floating-point format. Other aspects of the neural network can also be implemented, for example parameters regarding network topology, sparsity, types of nodes, and/or training parameters can be provided as part of implementing one or more layers of a neural network. After the neural network is implemented, forward propagation is performed for a layer of a neural network, producing second activation values in a first block floating-point format. The first block floating-point format may be selected according to a hardware accelerator used to process the activation values.

At process block 1420, at least one of the second activation values generated during forward propagation is converted to a second block floating-point format that has a non-uniform mantissa. For example, for the examples discussed above regarding FIGS. 9-12, any of the light lossy, normal lossy, aggressive lossy, or full range lossy mantissa formats can be used. Other aspects of the second block floating-point format can be different than the first block floating-point format. For example, the second block floating-point format can have a smaller mantissa, a smaller exponent, or a different shared exponent scheme than the first block floating-point format.

At process block 1430, some examples perform an additional, optional step of applying further compression to the compressed activation values prior to storing the activation values in bulk memory. Examples of suitable techniques for further compressing activation values in the compressed quantized format include entropy compression (e.g., Huffman encoding), zero compression, run length compression, compressed sparse row compression, or compressed sparse column compression.

At process block 1440, the compressed activation values from process block 1420 (or the further compressed activation values produced at optional process block 1430) are stored in storage or memory, such as a bulk memory. The bulk memory can be implemented in any suitable storage technology, including, for example, on- or off-chip DRAM, network accessible RAM, SSD drives, hard drives, or network-accessible storage. In some examples, the bulk memory is situated on a different integrated circuit than a hardware accelerator used process block floating-point values. In some examples, the bulk memory is situated on the same integrated circuit as a hardware accelerator used to process block floating-point values.

At process block 1450, backward propagation is performed for a layer of the neural network by converting the stored, compressed activation values into dequantized and (if compression was performed at process block 1430) uncompressed activation values. The uncompressed activation values can be expressed in the first, quantized block floating-point format or in a normal precision floating-point format. The format for the uncompressed activation values can be selected based on a hardware accelerator used to perform neural network operations at process block 1460. A different number of techniques can be used to dequantize lossy or non-uniform mantissas. For example, when the set of non-uniform mantissas is {0, 1, 3, 7} (stored, e.g., in two-bit mantissa format), those same values can be restored as the dequantized values in the first normal-precision (e.g., 8-, 16-, or 32-bit) or block floating-point (e.g., 3, 4, 5, or 6-bit) mantissa. In some examples, the dequantized mantissa can be an approximation. For example, for the set {0, 1, 3, 7}, the dequantized mantissas can be {0, 1, 3, 5}. In some examples, the dequantized value is selected in a deterministic fashion. For example, for the set {0, 1, 3, 7}, the value 3 can be dequantized to 2 the first time the value is encountered, 3 the second time, 4, the third time, then back to 2 on the fourth time the value is encountered. In some examples, a randomly-selected dequantized mantissa can be used. For example, for the set {0, 1, 3, 7}, the non-uniform mantissa value 3 can be translated to a random value selected from the set {2, 3, 5, 6} and the non-uniform mantissa value 7 can be translated to a random value selected from the set {5, 4, 6, 7}. In some examples, the random value is selected according to a uniform distribution, while in other examples, a normal (Gaussian), Poisson, or other probability distribution is used to select the de-quantized mantissa.

At process block 1460, a gradient operation is performed with the dequantized and (if compression was performed at process block 1430) uncompressed activation values. Such gradient operations are used as part of a neural network training process. For example, the gradient operations can be used to determine updated weights for nodes of a neural network.

At process block 1470, weights for portions of at least one node of the neural network are updated based on the compressed activation values. For example, gradients calculated at process block 1460 can be used to update weights for nodes of the neural network.

X. Example Computing Environment

Figure 15:
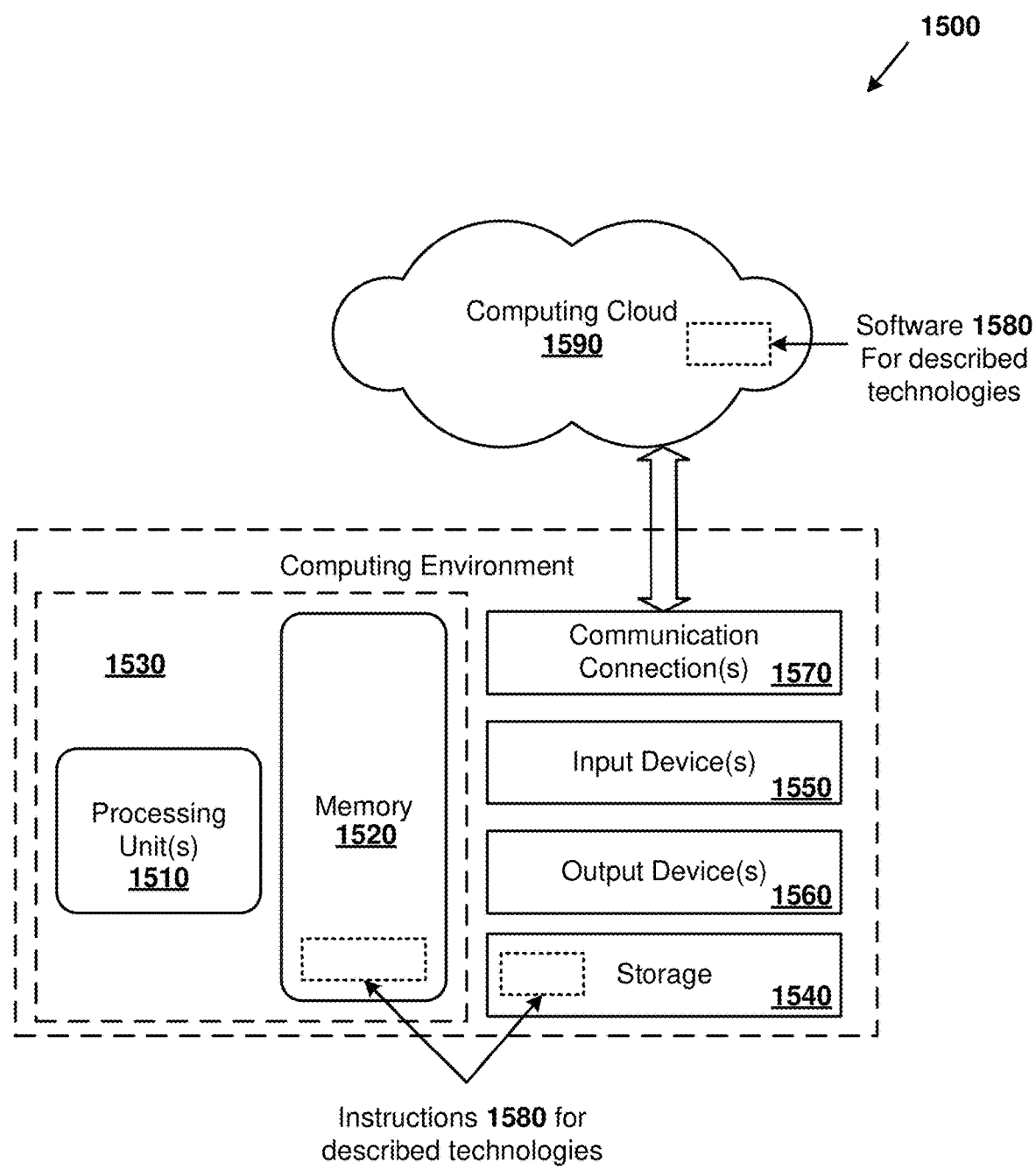
FIG. 15 is a block diagram illustrating a suitable computing environment for implementing certain examples of the disclosed technology.

FIG. 15 illustrates a generalized example of a suitable computing environment 1500 in which described embodiments, techniques, and technologies, including performing activation compression with lossy or non-uniform mantissas in a quantization environment, can be implemented.

The computing environment 1500 is not intended to suggest any limitation as to scope of use or functionality of the technology, as the technology may be implemented in diverse general-purpose or special-purpose computing environments. For example, the disclosed technology may be implemented with other computer system configurations, including hand held devices, multi-processor systems, programmable consumer electronics, network PCs, minicomputers, mainframe computers, and the like. The disclosed technology may also be practiced in distributed computing environments where tasks are performed by remote processing devices that are linked through a communications network. In a distributed computing environment, program modules may be located in both local and remote memory storage devices.

With reference to FIG. 15, the computing environment 1500 includes at least one processing unit 1510 and memory 1520. In FIG. 15, this most basic configuration 1530 is included within a dashed line. The processing unit 1510 executes computer-executable instructions and may be a real or a virtual processor. In a multi-processing system, multiple processing units execute computer-executable instructions to increase processing power and as such, multiple processors can be running simultaneously. The memory 1520 may be volatile memory (e.g., registers, cache, RAM), non-volatile memory (e.g., ROM, EEPROM, flash memory, etc.), or some combination of the two. The memory 1520 stores software 1580, images, and video that can, for example, implement the technologies described herein. A computing environment may have additional features. For example, the computing environment 1500 includes storage 1540, one or more input devices 1550, one or more output devices 1560, and one or more communication connections 1570. An interconnection mechanism (not shown) such as a bus, a controller, or a network, interconnects the components of the computing environment 1500. Typically, operating system software (not shown) provides an operating environment for other software executing in the computing environment 1500, and coordinates activities of the components of the computing environment 1500.

The storage 1540 may be removable or non-removable, and includes magnetic disks, magnetic tapes or cassettes, CD-ROMs, CD-RWs, DVDs, or any other medium which can be used to store information and that can be accessed within the computing environment 1500. The storage 1540 stores instructions for the software 1580, plugin data, and messages, which can be used to implement technologies described herein.

The input device(s) 1550 may be a touch input device, such as a keyboard, keypad, mouse, touch screen display, pen, or trackball, a voice input device, a scanning device, or another device, that provides input to the computing environment 1500. For audio, the input device(s) 1550 may be a sound card or similar device that accepts audio input in analog or digital form, or a CD-ROM reader that provides audio samples to the computing environment 1500. The output device(s) 1560 may be a display, printer, speaker, CD-writer, or another device that provides output from the computing environment 1500.

The communication connection(s) 1570 enable communication over a communication medium (e.g., a connecting network) to another computing entity. The communication medium conveys information such as computer-executable instructions, compressed graphics information, video, or other data in a modulated data signal. The communication connection(s) 1570 are not limited to wired connections (e.g., megabit or gigabit Ethernet, Infiniband, Fibre Channel over electrical or fiber optic connections) but also include wireless technologies (e.g., RF connections via Bluetooth, WiFi (IEEE 802.11a/b/n), WiMax, cellular, satellite, laser, infrared) and other suitable communication connections for providing a network connection for the disclosed agents, bridges, and agent data consumers. In a virtual host environment, the communication(s) connections can be a virtualized network connection provided by the virtual host.

Some embodiments of the disclosed methods can be performed using computer-executable instructions implementing all or a portion of the disclosed technology in a computing cloud 1590. For example, the disclosed methods can be executed on processing units 1510 located in the computing environment 1530, or the disclosed methods can be executed on servers located in the computing cloud 1590.

Computer-readable media are any available media that can be accessed within a computing environment 1500. By way of example, and not limitation, with the computing environment 1500, computer-readable media include memory 1520 and/or storage 1540. As should be readily understood, the term computer-readable storage media includes the media for data storage such as memory 1520 and storage 1540, and not transmission media such as modulated data signals.

XII. Experimental Results

Figure 16:
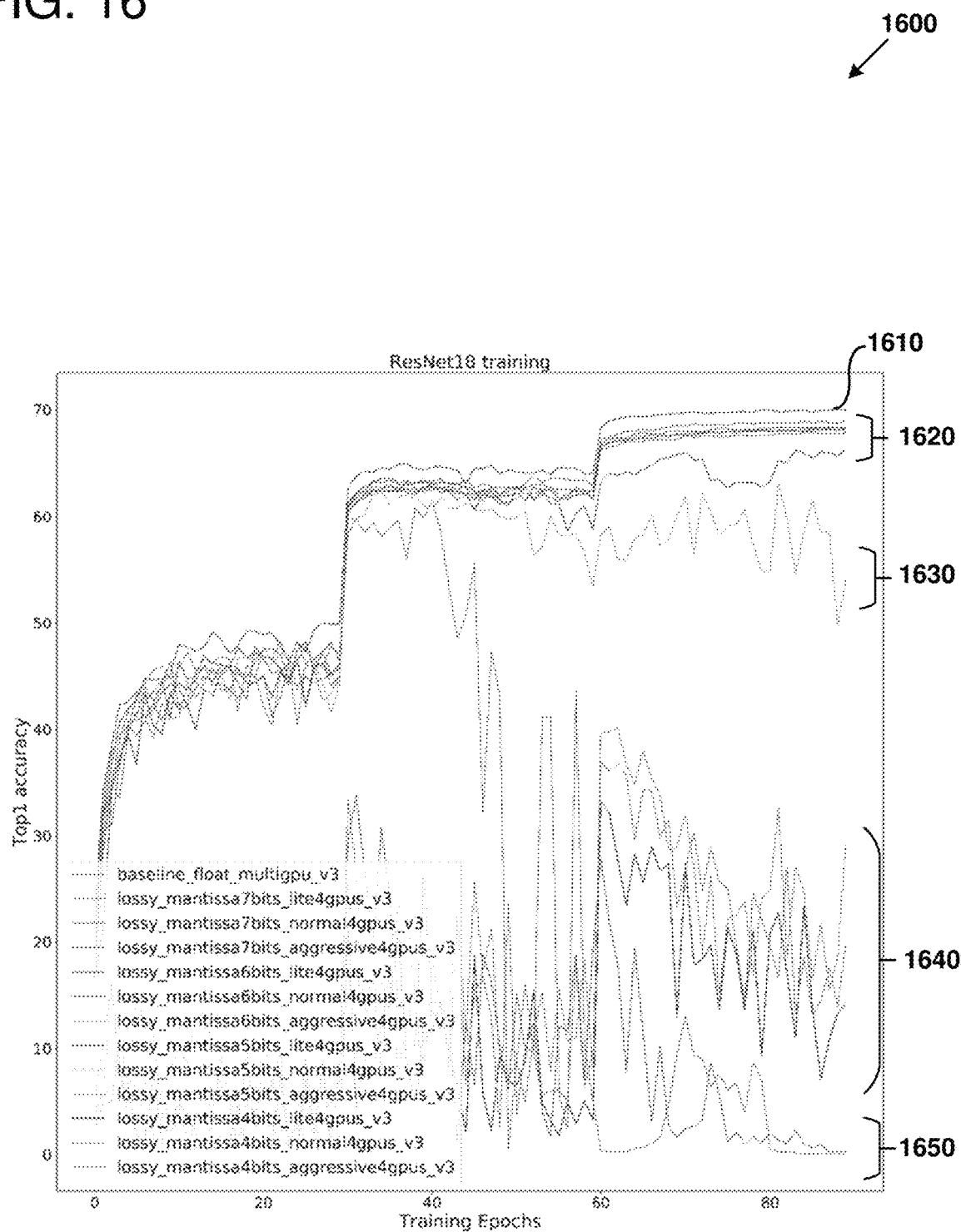
FIG. 16 is a chart showing accuracy results obtained when training a neural network with different non-uniform mantissa schemes, as can be observed when implementing some examples of the disclosed technology.

FIG. 16 is a chart 1600 of a number of plots showing accuracy of a neural network as it undergoes training over 90 training epochs using different schemes for compressing activation values using non-uniform mantissas. As training proceeds, the accuracy of the neural network being trained should generally increase. A first plot 1610 is for a baseline case where normal precision floating-point values are used to express the neural network activation values during training, without compression. A second set of plots 1620 is for a number of cases where different schemes for compressing activation values using lossy mantissas were employed. This second set includes seven-bit lossy mantissas including those according to a lite, normal, and aggressive non-uniform mantissa schemes, similar to those for three-bit mantissas discussed above regarding FIGS. 9-11. A third plot 1630 is for a test case using a five-bit mantissa with a normal, non-uniform mantissa scheme. A fourth set of plots 1640 is for a number of additional test cases where different schemes for compressing activation values using lossy mantissas were employed, including six-bit mantissas with an aggressive non-uniform mantissa scheme, five-bit mantissas with aggressive non-uniform mantissa scheme, and four-bit mantissas with a lite, non-uniform scheme. A fifth set of plots 1650 is for two test cases where there is a four-bit lossy mantissa according to a normal or aggressive non-uniform scheme.

Thus, one of ordinary skill in the relevant art having the benefit of the present disclosure would understand that performance of quantization enabled systems implementing neural networks using lossy or non-uniform mantissas can be improved over the baseline case. A scheme selected to achieve the desired level of accuracy can be selected. As shown in FIG. 16, the accuracy of some of these schemes approaches the baseline normal-precision floating-point case while realizing substantial improvements to memory usage, interconnect and width usage, network usage, energy usage, and reduce processor load, thereby improving performance of the quantization system itself.

XIII Additional Examples of the Disclosed Technology

Additional examples of the disclosed subject matter are discussed herein in accordance with the examples discussed above.

In some examples of the disclosed technology, a system of one or more computers can be configured to perform particular operations or actions by virtue of having software, firmware, hardware, or a combination of them installed on the system that in operation cause the system to perform the actions. One or more computer programs can be configured to perform particular operations or actions by virtue of including instructions that, when executed by data processing apparatus, cause the apparatus to perform the actions. One general aspect includes a computing system including: one or more processors, bulk memory including computer-readable storage devices and/or memory. The computing system also includes a floating-point compressor formed from at least one of the processors, the block floating-point compressor being in communication with the bulk memory. The computing system is configured to perform forward propagation for a layer of a neural network to produce first activation values in a first floating-point format, the first floating-point format having a normal mantissa format, convert at least one of the activation values to a second floating-point format to produce compressed activation values by mapping activation value mantissas to a non-uniform mantissa format, and, store the compressed activation values in the bulk memory. Other embodiments of this aspect include corresponding computer systems, apparatus, and computer programs recorded on one or more computer storage devices, each configured to perform the actions of the methods.

Certain implementations may include one or more of the following features. The computing system where the second floating-point format has a lower-precision mantissa than the first floating-point format. The computing system where the mapping includes: mapping mantissas having two or more mantissa values in the normal mantissa format to a single mantissa value in the non-uniform mantissa format. In some examples, the mapping includes: mapping first mantissas having one or more mantissa values in the normal mantissa format to a single mantissa value in the non-uniform mantissa format; and mapping second mantissas having at least one more mantissa values in the normal mantissa format to a single mantissa value in the non-uniform mantissa format. In some examples, the first and second floating-point formats are block floating-point formats, and the second floating-point format has a different sharing format of a common exponent than the first block floating-point format, the sharing format being different based on per-row, per-column, or per-tile sharing of a common exponent for the compressed activation values. In some examples, the compressor is further configured to further compress the compressed activation values prior to the storing by performing at least one or more of the following: entropy compression, zero compression, run length encoding, compressed sparse row compression, or compressed sparse column compression. In some examples, the computing system is further configured to: perform backward propagation for a layer of the neural network by converting the stored, compressed activation values to activation values in the first floating-point format to produce uncompressed activation values. In some examples, the computing system can also perform a gradient operation with the uncompressed activation values. In some examples, the layer is a first layer, the compressed activation values are first compressed activation values, the non-uniform mantissa format is a first non-uniform mantissa format, and where the computing system is further configured to: with at least one of the processors, perform forward propagation for a different, second layer of a neural network to produce second activation values in the first floating-point format; with the floating-point compressor, for at least one of the second activation values, convert the at least one of the second activation values to a third floating-point format to produce second compressed activation values, the third floating-point format having a activation value mantissas in a second non-uniform mantissa format different than the first non-uniform mantissa format; and with at least one of the processors, storing the second compressed activation values in the bulk memory.

In some examples of the computing system, the second floating-point format includes lossy mantissas. In some examples, the second floating-point format includes non-uniform mantissas. In some examples, the second floating-point format includes non-uniformly spaced mantissa values. In some examples, the second floating-point format includes mantissa values that are nonuniformly mapped from the first floating-point format. In some examples, a light lossy mantissa, a normal lossy mantissa, and/or an aggressive lossy mantissa is used. In some examples of the computing system, the third floating-point format includes lossy mantissas. In some examples, the third floating-point format includes non-uniform mantissas. In some examples, the third floating-point format includes non-uniformly spaced mantissa values. In some examples, the third floating-point format includes mantissa values that are nonuniformly mapped from the first floating-point format or the second floating point format. In some examples, a light lossy mantissa, a normal lossy mantissa, and/or an aggressive lossy mantissa is used.

In some examples, the processors include at least one of the following: a tensor processing unit, a neural network accelerator, a graphics processing unit, or a processor implemented in a reconfigurable logic array; and the bulk memory is situated on a different integrated circuit than the processors. The computing system where the bulk memory includes dynamic random access memory (DRAM) or embedded DRAM and the system further includes a hardware accelerator including a memory temporarily storing the first activation values for at least a portion of only one layer of the neural network, the hardware accelerator memory including static ram (SRAM) or a register file. Implementations of the described techniques may include hardware, a method or process, or computer software on a computer-accessible medium.

One general aspect includes a method of operating a computing system implementing a neural network, the method including: with the computing system: forward propagating a layer of the neural network to generate activation values in a first floating-point format; converting at least one of the activation values to a second, block floating-point format having non-uniform mantissas, generating compressed activation values; and storing the compressed activation values in a computer-readable memory or storage device. Other embodiments of this aspect include corresponding computer systems, apparatus, and computer programs recorded on one or more computer storage devices, each configured to perform the actions of the methods.

Certain implementations may include one or more of the following features. The method where the second block floating-point format has one of the following mantissa formats: lite lossy format, normal lossy format, or aggressive lossy format. The method where the second block floating-point format has a lite lossy mantissa format, the lite lossy mantissa format including: a one-to-one mapping for a selected lowest value mantissa in the first floating-point format. The method may also include a one-to-one mapping for a selected highest value mantissa in the first floating-point format. The method may also include a two or more-to-one mapping for at least two other mantissa values in the first floating-point format. The method may also include a non-uniform mapping for at least two mantissa values in the first floating-point format. In some examples, the second block floating-point format has an aggressive lossy mantissa format, the aggressive lossy mantissa format including: a one-to-one mapping for a selected lowest value mantissa in the first floating-point format. The method may also include a mapping for all other mantissa values besides the selected lowest value mantissa in the first floating-point format. The method further including: prior to the storing, further compressing the compressed activation values stored in the computer-readable memory or storage device by one or more of the following techniques: entropy compression, zero compression, run length encoding, compressed sparse row compression, or compressed sparse column compression. In some examples, the second block floating-point format has a two or more-to-one mapping for at least two mantissa values in the first floating-point format, the method further including: with the computing system, dequantizing the compressed activation values by converting at least one mantissa of the compressed activation values to an average value based on the at least two mantissa values. In some examples, the second block floating-point format has a two or more-to-one mapping for at least two mantissa values in the first floating-point format, the method further including: with the computing system, dequantizing the compressed activation values by converting at least one mantissa of the compressed activation values to a randomly-selected value of the at least two mantissa values. In some examples, the method further includes: with the computing system, performing backward propagation for a layer of the neural network by converting the stored, compressed activation values to activation values in the first block floating-point format to uncompressed activation values. The method may also include with the computing system, performing a gradient operation with the uncompressed activation values. The method may also include with the computing system, updating weights for at least one node of the neural network based on the uncompressed activation values. The method can further include: with the computing system, performing backward propagation for a layer of the neural network by converting the stored, compressed activation values to activation values in the first block floating-point format to uncompressed activation values. The method may also include with the computing system, performing a gradient operation with the uncompressed activation values; and with the computing system, updating weights for a portion of at least one node of the neural network based on the uncompressed activation values, where the at least one node is one of the following: a long-short term memory node (LSTM), a gated recurrent unit (GRU). The method can further include: selecting the second block floating-point format based on an attribute of the layer, the attribute being selected from the group including of the following: the layer being a convolution layer, the layer including a long-short term memory node (LSTM), the layer including a gated recurrent unit (GRU), the layer being fully-connected to another layer, the layer being sparsely-connected to another layer, the layer being an attention layer, the layer being a normalization layer. Certain implementations of the described techniques may include hardware, a method or process, or computer software on a computer-accessible medium.

One general aspect includes one or more computer-readable storage devices or media storing computer-executable instructions, which when executed by a computer, cause the computer to perform a method of configuring a computer system to implement an artificial neural network, the instruction including: instructions that cause the computer system to implement a first layer of neural network using first weights and/or first activation values expressed in a first block floating-point format. The one or more computer-readable storage devices also includes instructions that cause the computer system to forward propagate values from the first layer of the neural network to a second layer of the neural network, thereby generating second activation values expressed in the first block floating-point format. The one or more computer-readable storage devices also includes instructions that cause the computer system to, prior to performing back propagation for the neural network, store the second activation values in a second, different block floating-point format having a lossy mantissa format in a bulk memory or storage device in communication with the computer system. Other embodiments of this aspect include corresponding computer systems, apparatus, and computer programs recorded on one or more computer storage devices, each configured to perform the actions of the methods.

In some examples of the computer-readable storage media, the second floating-point format includes lossy mantissas. In some examples, the second floating-point format includes non-uniform mantissas. In some examples, the second floating-point format includes non-uniformly spaced mantissa values. In some examples, the second floating-point format includes mantissa values that are nonuniformly mapped from the first floating-point format. In some examples, a light lossy mantissa, a normal lossy mantissa, and/or an aggressive lossy mantissa is used. In some examples of the computing system, the third floating-point format includes lossy mantissas. In some examples, the third floating-point format includes non-uniform mantissas. In some examples, the third floating-point format includes non-uniformly spaced mantissa values. In some examples, the third floating-point format includes mantissa values that are nonuniformly mapped from the first floating-point format or the second floating point format. In some examples, a light lossy mantissa, a normal lossy mantissa, and/or an aggressive lossy mantissa is used.

One general aspect further includes instructions that cause the computer system temporarily store the first weights and/or the first activation values in a different memory than the bulk memory or storage device. Other embodiments of this aspect include corresponding computer systems, apparatus, and computer programs recorded on one or more computer storage devices, each configured to perform the actions of the methods.

Another general aspect further includes instructions that cause the computer system to further compress the second activation values prior to storing the further compressed values in the bulk memory or storage device. Other embodiments of this aspect include corresponding computer systems, apparatus, and computer programs recorded on one or more computer storage devices, each configured to perform the actions of the methods.

Certain of the disclosed methods can be implemented as computer-executable instructions stored on one or more computer-readable media (e.g., computer-readable media, such as one or more optical media discs, volatile memory components (such as DRAM or SRAM), or nonvolatile memory components (such as hard drives)) and executed on a computer (e.g., any commercially available computer, including smart phones or other mobile devices that include computing hardware). Any of the computer-executable instructions for implementing the disclosed techniques, as well as any data created and used during implementation of the disclosed embodiments, can be stored on one or more computer-readable media (e.g., computer-readable storage media).

In view of the many possible embodiments to which the principles of the disclosed subject matter may be applied, it should be recognized that the illustrated embodiments are only preferred examples and should not be taken as limiting the scope of the claims to those preferred examples. Rather, the scope of the claimed subject matter is defined by the following claims. We therefore claim as our invention all that comes within the scope of these claims.

What is claimed is:

1. A computing system comprising:
   one or more hardware processors;
   at least one memory coupled to the one or more hardware processors; and
   one or more computer-readable storage media storing computer-executable instructions that, when executed, cause the computing system to perform operations comprising:
      performing forward propagation for a first layer of a neural network using values in a first floating-point format to produce first activation values in the first floating-point format or a second floating-point format different than the first floating-point format, the first floating-point format and the second floating-point format having uniform mantissas;

converting at least one of the activation values to a third floating-point format having a non-uniform mantissa to provide compressed activation values;

storing the compressed activation values in the at least one memory; and propagating the activation values in the first floating-point format or the second floating point format to a second layer of the neural network to produce second activation values in a fourth floating-point format, the fourth floating-point format being different than the first floating point format and being different than the second floating point format.

2. The computing system of claim 1, wherein the fourth floating-point format has a non-uniform mantissa.

3. The computing system of claim 2, wherein the fourth floating-point format is the third floating-point format.

4. The computing system of claim 2, wherein the fourth floating-point format is different than the third floating-point format.

5. The computing system of claim 1, wherein the second-floating point format is a quantized floating-point format and the operations further comprise:

dequantizing the activation values in the second floating-point format to provide activation values in the first floating-point format and the activation values in the first floating-point format are propagated to the second layer of the neural network.

6. The computing system of claim 1, wherein the second floating-point format is the first floating-point format.

7. The computing system of claim 1, wherein the first floating-point format is a normal precision floating-point format and the second floating-point format is different than the first floating-point format and has reduced precision compared with the first floating-point format.

8. The computing system of claim 1, wherein the third floating-point format is selected based on properties of the second layer of the neural network.

9. The computing system of claim 1, the operations further comprising:

adjusting a quantization process for the second layer of the neural network based on properties of the second layer of the neural network, the adjusting comprising adjusting bounding box selection.

10. The computing system of claim 1, wherein the fourth floating point format has a uniform mantissa, the operations further comprising:

converting at least one of the activation values in the fourth floating-point format to a fifth floating-point format having a non-uniform mantissa.

11. The computing system of claim 10, wherein the fourth floating-point format is the third floating-point format.

12. The computing system of claim 10, wherein the fourth floating-point format is different than the third floating-point format.

13. The computing system of claim 10, the operations further comprising:

during backpropagation, retrieving activation values for the second layer of the neural network stored in the fifth floating-point format;

converting the activation values in the fifth floating-pointing format to the fourth floating-point format; and updating weights of the neural network using a measure of loss and the activation values in the fifth floating-point format.

14. The computing system of claim 13, wherein the fourth floating-point is a normal precision floating-point format.

15. The computing system of claim 13, wherein the fourth floating-point is a reduced precision floating-point format.

16. A method, implemented in a computing system comprising at least one hardware processor and at least one memory coupled to the at least one hardware processor, the method comprising:

during backward propagation in a neural network comprising a plurality of layers, retrieving activation values for a first layer of the neural network stored in a first floating-point format having a non-uniform mantissa;

converting the activation values for the first layer of the neural network to a second floating-point format having a uniform mantissa; and updating weights of the neural network using a measure of loss and the activation values in the second floating-point format.

17. The method of claim 16, wherein the second floating-point format is a normal precision floating-point format.

18. The method of claim 16, wherein the second floating-point format is a reduced precision floating-point format.

19. One or more non-transitory computer-readable storage media comprising:

computer-executable instructions that, when executed by a computing system comprising at least one hardware processor and at least one memory coupled to the at least one hardware processor, cause the computing system to perform forward propagation for a first layer of a neural network using values in a first floating-point format to produce first activation values in the first floating-point format or a second floating-point format different than the first floating-point format, the first floating-point format and the second floating-point format having uniform mantissas;

computer-executable instructions that, when executed by the computing system, cause the computing system to convert at least one of the activation values to a third floating-point format having a non-uniform mantissa to provide compressed activation values;

computer-executable instructions that, when executed by the computing system, cause the computing system to store the compressed activation values in the at least one memory;

computer-executable instructions that, when executed by the computing system, cause the computing system to propagate the activation values in the first floating-point format or the second floating point format to a second layer of the neural network to produce second activation values in a fourth floating-point format, the fourth floating-point format being different than the first floating point format and being different than the second floating point format.

20. The one or more non-transitory computer-readable storage media of claim 19, wherein the fourth floating-point format is selected based on properties of the second layer of the neural network.

* * * * *